US012756156B2

(12) United States Patent
Blanchard et al.

(10) Patent No.: US 12,756,156 B2
(45) Date of Patent: Oct. 6, 2026

(54) DEVICES AND METHODS FOR QUARTZ ENHANCED PHOTOACOUSTIC SPECTROSCOPY

(71) Applicant: Pendar Technologies Inc., Cambridge, MA (US)

(72) Inventors: Romain Blanchard, Lexington, MA (US); Daryoosh Vakhshoori, Cambridge, MA (US)

(73) Assignee: Pendar Technologies Inc., Cambridge, MA (US)

( * ) Notice: Subject to any disclaimer, the term of this patent is extended or adjusted under 35 U.S.C. 154(b) by 509 days.

(21) Appl. No.: 18/353,406

(22) Filed: Jul. 17, 2023

(65) Prior Publication Data

US 2023/0358709 A1 Nov. 9, 2023

Related U.S. Application Data

(60) Continuation of application No. 17/136,170, filed on Dec. 29, 2020, now abandoned, which is a division of (Continued)

(51) Int. Cl.
*H01S 5/10* (2021.01)
*H01S 3/00* (2006.01)

(Continued)

(52) U.S. Cl.
CPC .......... *H01S 5/1085* (2013.01); *H01S 3/0014* (2013.01); *H01S 3/0615* (2013.01);

(Continued)

(58) Field of Classification Search
CPC .... H01S 5/1085; H01S 3/0014; H01S 3/0615; H01S 5/0208; H01S 5/023; H01S 5/0267; H01S 5/12; H01S 5/34
See application file for complete search history.

(56) References Cited

U.S. PATENT DOCUMENTS 4,223,607 A 9/1980 Muller et al.
4,853,543 A 8/1989 Ozdemir (Continued)

FOREIGN PATENT DOCUMENTS

JP 2013521504 A 6/2013
WO 2011109557 A1 9/2011

(Continued)

OTHER PUBLICATIONS

A. Lyakh et al. ("Substrate-emitting, distributed feedback quantum cascade lasers." Applied Physics Letters 91, pp. 181116-181116-3, 2007) (Year: 2007).*

(Continued)

*Primary Examiner* — Yuanda Zhang
(74) *Attorney, Agent, or Firm* — Smith Baluch LLP

(57) ABSTRACT

In quartz-enhanced photoacoustic spectroscopy (QEPAS), an analyte (typically in gas phase) generates a pressure wave in response to incident laser light. A quartz tuning fork (QTF) resonant at the frequency of the pressure wave transduces the pressure wave into an electrical signal. Pulsing the laser briefly reduces the amount of thermal chirp and increases the fraction of time that the laser emits at the wavelength(s) of interest. This increases the measurement efficiency. Pulsing the incident laser light with bursts of short pulses at the QTF resonant frequency increases signal strength. Exciting the sample with a two pulses at different laser wavelengths, separated by a half QTF period yields signal and background acoustic waves that partially cancel when integrated by the QTF, producing a differential measurement. Pulsing the incident laser light at a frequency faster than the gas response cut off frequency can improve the noise performance of a QEPAS measurement.

26 Claims, 24 Drawing Sheets

Related U.S. Application Data application No. 15/840,644, filed on Dec. 13, 2017, now Pat. No. 10,908,129.

(60) Provisional application No. 62/433,487, filed on Dec. 13, 2016.

(51) Int. Cl.

| | |
|---|---|
| ***H01S 3/06*** | (2006.01) |
| ***H01S 5/02*** | (2006.01) |
| ***H01S 5/023*** | (2021.01) |
| ***H01S 5/026*** | (2006.01) |
| ***H01S 5/12*** | (2021.01) |
| ***H01S 5/34*** | (2006.01) |
| *G01N 29/02* | (2006.01) |
| *G01N 29/036* | (2006.01) |
| *G01N 29/24* | (2006.01) |
| *G01N 29/34* | (2006.01) |
| *H01S 5/00* | (2006.01) |

(52) U.S. Cl.

CPC ............ *H01S 5/0208* (2013.01); *H01S 5/023* (2021.01); *H01S 5/0267* (2013.01); *H01S 5/12* (2013.01); *H01S 5/34* (2013.01); *G01N 29/022* (2013.01); *G01N 29/036* (2013.01); *G01N 29/2418* (2013.01); *G01N 29/348* (2013.01); *G01N 2291/021* (2013.01); *H01S 5/005* (2013.01); *H01S 5/3401* (2013.01)

(56) References Cited

U.S. PATENT DOCUMENTS

| | | | |
|---|---|---|---|
| 5,243,983 A | 9/1993 | Tarr et al. | |
| 5,253,263 A | 10/1993 | Jansen et al. | |
| 6,556,610 B1 * | 4/2003 | Jiang | H01S 5/18369 372/50.1 |
| 6,560,478 B1 | 5/2003 | Alfano et al. | |
| 8,327,686 B2 | 12/2012 | Kachanov et al. | |
| 8,359,904 B2 | 1/2013 | Nicoletti et al. | |
| 8,379,206 B2 | 2/2013 | Kachanov et al. | |
| 8,441,644 B2 | 5/2013 | Kachanov et al. | |
| 8,539,816 B2 | 9/2013 | Kachanov et al. | |
| 8,593,636 B2 | 11/2013 | Kristiansen et al. | |
| 9,121,838 B2 | 9/2015 | Farooq et al. | |
| 9,243,998 B2 | 1/2016 | Avramescu et al. | |
| 10,908,129 B2 | 2/2021 | Blanchard et al. | |
| 2003/0127596 A1 | 7/2003 | Kosterev et al. | |
| 2009/0097519 A1 * | 4/2009 | Brick | H01S 5/185 372/44.01 |
| 2009/0129421 A1 * | 5/2009 | Kitatani | H01S 5/125 372/50.23 |
| 2010/0177794 A1 | 7/2010 | Peng et al. | |
| 2011/0026031 A1 | 2/2011 | Kristiansen et al. | |
| 2011/0088453 A1 | 4/2011 | Nicoletti et al. | |
| 2011/0214479 A1 | 9/2011 | Kachanov et al. | |
| 2011/0214480 A1 | 9/2011 | Kachanov et al. | |
| 2011/0214481 A1 | 9/2011 | Kachanov et al. | |
| 2011/0216311 A1 | 9/2011 | Kachanov et al. | |
| 2012/0033220 A1 | 2/2012 | Kotidis et al. | |
| 2013/0008229 A1 | 1/2013 | Avramescu et al. | |
| 2013/0008230 A1 | 1/2013 | Avramescu et al. | |
| 2013/0114078 A1 | 5/2013 | Honda et al. | |
| 2014/0293283 A1 | 10/2014 | Farooq et al. | |
| 2015/0101411 A1 | 4/2015 | Zalev et al. | |
| 2016/0156153 A1 * | 6/2016 | Belkin | H01S 5/5054 372/45.012 |
| 2016/0235304 A1 | 8/2016 | Tzoumas et al. | |
| 2017/0012408 A1 | 1/2017 | Hashimoto et al. | |
| 2017/0063044 A1 | 3/2017 | Dougakiuchi et al. | |
| 2018/0048118 A1 | 2/2018 | Lyakh | |
| 2019/0346537 A1 | 11/2019 | Krelboim et al. | |

FOREIGN PATENT DOCUMENTS

| | | | |
|---|---|---|---|
| WO | 2017097276 | A1 | 6/2017 |
| WO | 2017097824 | A1 | 6/2017 |

OTHER PUBLICATIONS

Chen et al., "Standoff photoacoustic detecti not explosives using quantum cascade laser and ultrasensitive microphone," Applied Optics, vol. 52, No. 12, pp. 2626-2632 (Apr. 2013).
Coddington et al., "Dual-comb spectroscopy," Optica, vol. 3, pp. 414-426 (Apr. 2016).
Dong, L. et al., "Ppb-level detection of nitric oxide using an external cavity quantum cascade laser based QEPAS sensor," Optics Express, vol. 19, No. 24, pp. 24037-24045 (Nov. 21, 2011).
Dong, L. et al., "QEPAS spectrophones: design, optimization, and performance," Appl. Phys. B, 100, pp. 627-635 (2010).
Duxbury, G. et al., "Quantum cascade semiconductor infrared and far-infrared lasers: from trace gas sensing to non-linear optics," Chem. Soc. Rev., 34, pp. 921-934 (2005).
Ezra Ip et al., "Coherent detection in optical fiber systems," Opt. Express 16, pp. 753-791 (2008).
Kosterev, A. A. et al., "Applications of quartz tuning forks in spectroscopic gas sensing," Review of Scientific Instruments 76, pp. 043105-1-043105-9 (2005).
Lee, B. G. et al., "Widely tunable single-mode quantum cascade laser source for mid-infrared spectroscopy," Appl. Phys. Lett. 91, 231101 (2007); doi: 10.1063/1.2816909, 4 pages.
Lyakh et al. "Substrate-emitting, distributed feedback quantum cascade lasers." Applied Physics Letters 91.18 (2007): 181116, 4 pages.
McManus, J. B. et al., "A high precision pulsed quantum cascade laser spectrometer for measurements of stable isotopes of carbon dioxide," Journal of Modern Optics, vol. 52, No. 16, pp. 2309-2321 (Nov. 2005).
Miklós, A. et al., "Application of acoustic resonators in photoacoustic trace gas analysis and metrology," Review of Scientific Instruments, vol. 71, No. 4, pp. 1937-1955 (Apr. 2001).
Namjou, K. et al., "Sensitive absorption spectroscopy with a room-temperature distributed-feedback quantum-cascade laser," Optics Letters, vol. 23, No. 3, pp. 219-221 (Feb. 1, 1998).
Nesci, A. et al., "Quantitative amplitude and phase measurement by use of a heterodyne scanning near-field optical microscope," Optics Letters 26, Issue 4, pp. 208-210 (2001).
Nikodem, M. et al., "Chirped laser dispersion spectroscopy with harmonic detection of molecular spectra," Appl. Phys. B 109, pp. 477-483 (2012).
Nikodem, M. et al., "Chirped lasers dispersion spectroscopy implemented with single- and dual-sideband electro-optical modulators," Optics Express, vol. 21, No. 12 (Jun. 2013); doi: 10.1364/OE.21.014649, 7 pages.
Patimisco, P. et al., "Quartz-Enhanced Photoacoustic Spectroscopy: A Review," Sensors 14, pp. 6165-6206 (2014); doi: 10.3390/s140406165.
Spagnolo, V. et al., Part-per-trillion level SF6 detection using a quartz enhanced photoacoustic spectroscopy-based sensor with single-mode fiber-coupled quantum cascade laser excitation, Optics Letters, vol. 37, No. 21, pp. 4461-4463 (Nov. 1, 2012).
Suess et al. "Single-mode quantum cascade laser array emitting from a single facet." IEEE Photonics Technology Letters 28.11 (2016): 1197-1200.
Van Neste, C. W. et al., "Standoff photoacoustic spectroscopy," Applied Physics Letters 92, pp. 234102-1-234102-3 (2008).
Wysocki, G. et al., "Spectroscopic trace-gas sensor with rapidly scanned wavelengths of a pulsed quantum cascade laser for in situ NO monitoring of industrial exhaust systems," Appl. Phys. B, 80, pp. 617-625 (2005).

* cited by examiner

FIG. 2A
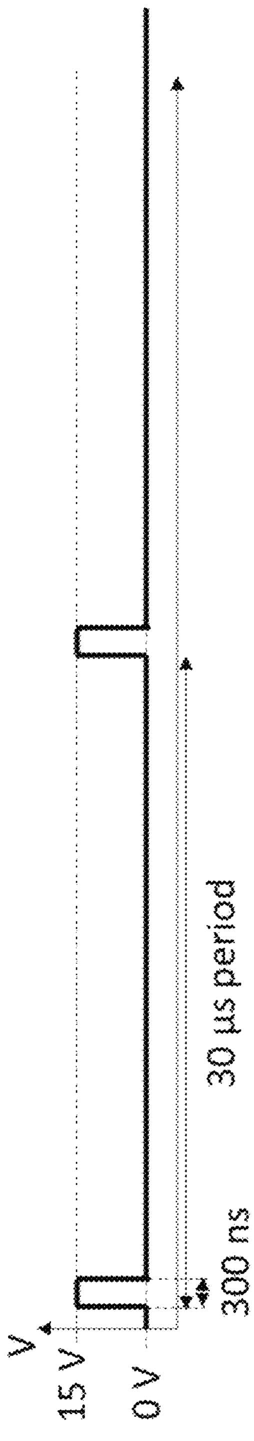
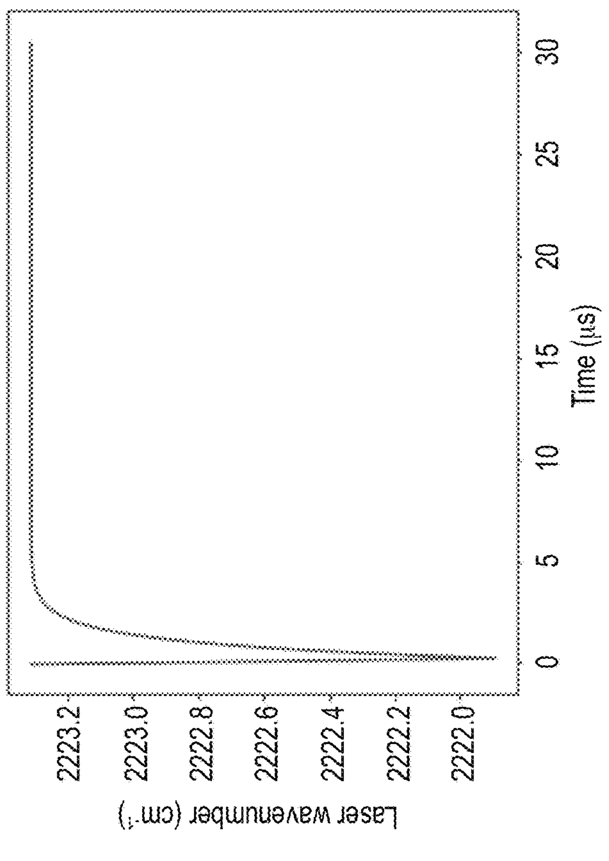
FIG. 2B
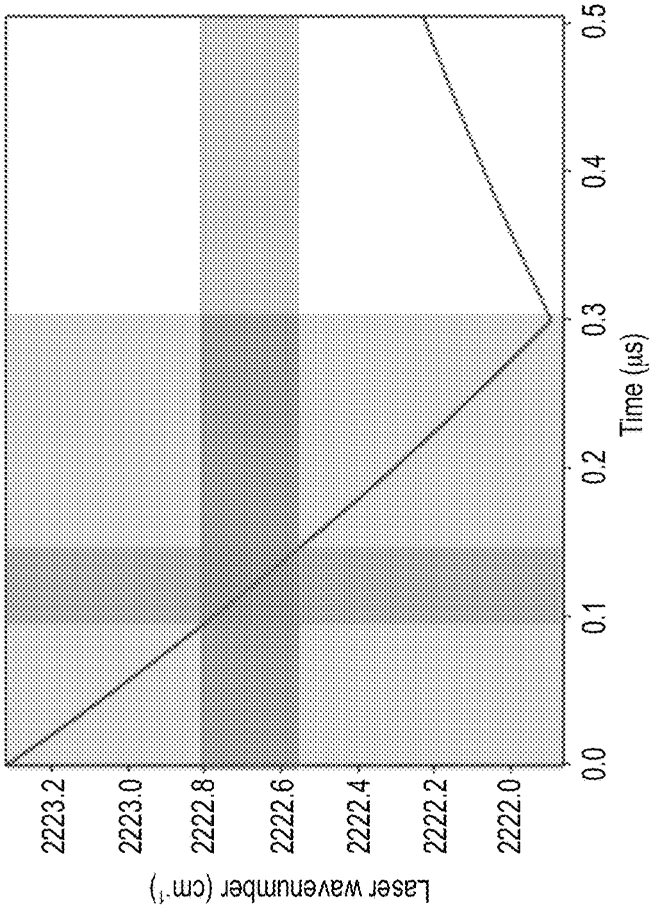
FIG. 2C

DEVICES AND METHODS FOR QUARTZ ENHANCED PHOTOACOUSTIC SPECTROSCOPY

CROSS-REFERENCE TO RELATED APPLICATION(S)

This application is a continuation of U.S. application Ser. No. 17/136,170, filed on Dec. 29, 2020, which is a divisional of U.S. application Ser. No. 15/840,644, filed on Dec. 13, 2017, which claims the priority benefit, under 35 U.S.C. 119(e), of U.S. Application No. 62/433,487, filed on Dec. 13, 2016. Each of these applications is incorporated herein by reference in its entirety.

BACKGROUND

Photoacoustic spectroscopy (PAS) is an analytical chemistry method that relies on the absorption of light by an analyte (typically in gas phase), whose subsequent collisional relaxation generates a pressure wave, detected by a microphone. Quartz-enhanced PAS (QEPAS) is a particular implementation of PAS that uses an ultra-sensitive quartz tuning fork (QTF) as the microphone. Typical modulation frequencies for QEPAS experiments are in the 5-100 kHz range, with 32.8 kHz being a particularly favored frequency due to the widespread availability of extremely cheap tuning forks resonant at this frequency, typically used for time measurement in wrist-watches.

In this case, the absorbed energy is transferred via a pressure wave to a mechanical resonator, typically in the shape of a tuning fork. Due to its fairly large quality factor (10,000), the mechanical resonator integrates the signal in the analog domain, before transduction into an electrical signal, typically using the piezoelectric properties of the tuning fork material (e.g., quartz). This analog integration in the mechanical domain reduces the readout noise of the electrical signal.

One advantage of QEPAS as a particular form of PAS is that no optical detector is required since the QTF acts as an uncooled, wavelength insensitive detector. Furthermore, PAS applications benefit from QTF's small size (few $mm^3$), extremely high quality factor (10,000 at atmospheric pressure), low cost (<$1 for a standard 32 kHz QTF), and excellent repeatability. In addition, the noise level is ultimately limited by the thermal noise of the QTF, which is a few microvolts at room temperature. The best results have been obtained in the mid-IR fingerprint range where the strongest target gas absorption lines occur. A record value of a few tens of parts-per-trillion (ppt) in volume was obtained for sulfur hexafluoride ($SF_6$) detection employing an external cavity mid-IR QCL fiber coupled to the QEPAS module.

SUMMARY

We present here several devices and methods aimed at improving QEPAS's signal strength and quality; its robustness against unwanted background signals of electrical, mechanical, and optical origin; and its robustness against varying environmental conditions (e.g., humidity, temperature, and the presence of different chemical species in the air). The devices and methods presented can be used to obtain quantitative measurements of the concentrations of target analytes. Furthermore, different implementations of QEPAS sensors are presented, including QEPAS sensors whose sources and spectrophones are integrated for low cost, easy assembly, and scalable production.

The description below uses QEPAS as an application field, although most of the solutions presented are not specific to the use of a tuning fork as an acoustic detector and can thus apply to photoacoustic spectroscopy in general. In particular, the different modulation schemes, the use of humidity sensors, and the strategies for electrical pick-up noise cancellation are all applicable to general photoacoustic spectroscopy.

Embodiments of the present technology include methods of making spectroscopic measurements of samples. Examples of these methods include modulating a single-mode laser with a repetitive pulse sequence so as to cause the laser to emit a periodically pulsed laser beam. Each period of the repetitive pulse sequence comprises a plurality of pulses. The periodically pulsed laser beam illuminates the sample, which cases the sample to reflect, scatter, transmit, and/or emit radiation (e.g., light or acoustic waves). A resonant detector whose resonance frequency is equal to a pulse repetition frequency of the periodically pulsed laser beam detects this radiation.

In some implementations, the periodically pulsed laser beam has a duty cycle of less than 50%. Each period of the periodically pulsed laser beam may comprises a burst of pulses, with each pulse in the burst of pulses spanning a bandwidth of less than 1 $cm^{-1}$ or less than 0.2 $cm^{-1}$. In some cases, the burst of pulses spans less than half of the period of the periodically pulsed laser beam.

Each period of the periodically pulsed laser beam may comprise at least one first pulse centered at a first wavelength and at least one second pulse centered at a second wavelength different than the first wavelength. The second pulse is delayed with respect to the first pulse by half the period of the periodically pulsed laser beam. The first and second pulses may cause the sample to reflect, scatter, transmit, and/or emit first and second radiation. If so, the resonant detector detect interference between the first and second radiation.

Depending on the measurement, light reflected, scattered, and/or transmitted by the sample may excite the resonant detector. Alternatively, the sample may emit an acoustic wave in response to the periodically pulsed laser beam with the resonant detector. The resonant detector detects this acoustic wave, which causes the resonant detector to oscillate. These oscillations are converted into electrical signals, e.g., using the piezoelectric effect.

Another example method of making a spectroscopic measurement of a sample includes illuminating a sample with a periodically pulsed laser beam, each period of which comprises at least one first pulse centered at a first wavelength and at least one second pulse centered at a second wavelength different than the first wavelength. Again, the second pulse is delayed with respect the at least one first pulse by half the period of the periodically pulsed laser beam. If desired, the temperature of the single-mode laser may be tuned between the first and second pulses so as to change the output wavelength.

A resonant detector with a resonance frequency substantially equal to a pulse repetition frequency of the periodically pulsed laser beam detecting interference between first radiation reflected, scattered, transmitted, and/or emitted by the sample in response to the first pulse and second radiation reflected, scattered, transmitted, and/or emitted by the sample in response to the second pulse. Depending on the measurement, the first radiation may represent an absorption resonance of the sample and the second radiation may represent background absorption of the sample.

Yet another method of making a spectroscopic measurement of a sample includes emitting a sequence of pulses from a single-mode laser. The sequence of pulses illuminates the sample, causing the sample to transmit, reflect, emit, and/or scatter radiation. A detection system whose a low-pass cutoff frequency is less than a pulse repetition frequency of the sequence of pulses detects this radiation.

Still another a method of making a spectroscopic measurement of a sample includes modulating a single-mode laser with a repetitive pulse sequence so as to cause the laser to emit a periodically pulsed laser beam. Again, each period of the repetitive pulse sequence comprises a plurality of pulses. The periodically pulsed laser beam illuminates the sample, which reflects, scatters, transmits, and/or emit radiation (e.g., light or acoustic waves) in response. A detector generates an electrical signal representing this radiation. And a filter, lock-in amplifier, processor, or other circuitry bandpass filters the electrical signal at a band centered on the pulse repetition frequency.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 1A is a schematic of a system for quartz-enhanced photoacoustic spectroscopy (QEPAS). The quartz tuning fork detector is typically inside the gas chamber since that is where the acoustic wave exciting the tuning fork is usually generated. A humidity sensor is added in the gas chamber.

illustrates a complex but periodic pulse sequence for modulating a single-mode laser (lower trace) and the acoustic modulation period (upper trace) generated by illuminating a sample with the laser light emitted by the single-mode laser in response to the periodic pulse sequence.

FIG. 2A shows a simple pulse pattern with a single pulse per period for modulating a single-mode laser, such as a distributed feedback (DFB) quantum cascade laser (QCL).

FIG. 2B is a plot of the time evolution of the laser light frequency emitted by a single-mode laser in response to the simple pulse pattern shown in FIG. 2A, within one repetition period at 32.8 kHz, assuming a single drive pulse of 300 ns starting at t=0, and a thermal relaxation time constant for the active region of 0.8 μs (this value will be used in all following examples).

FIG. 2C is a close-up of the plot in FIG. 2B showing with shading indicating that if, for example, a gas only absorbs at laser wavelengths between 2221.42222.6 $cm^{-1}$ and 22212222.8 $cm^{-1}$, then the photoacoustic signal is only generated during <50 ns of the total 300 ns of the pulse.

Figure 3A:
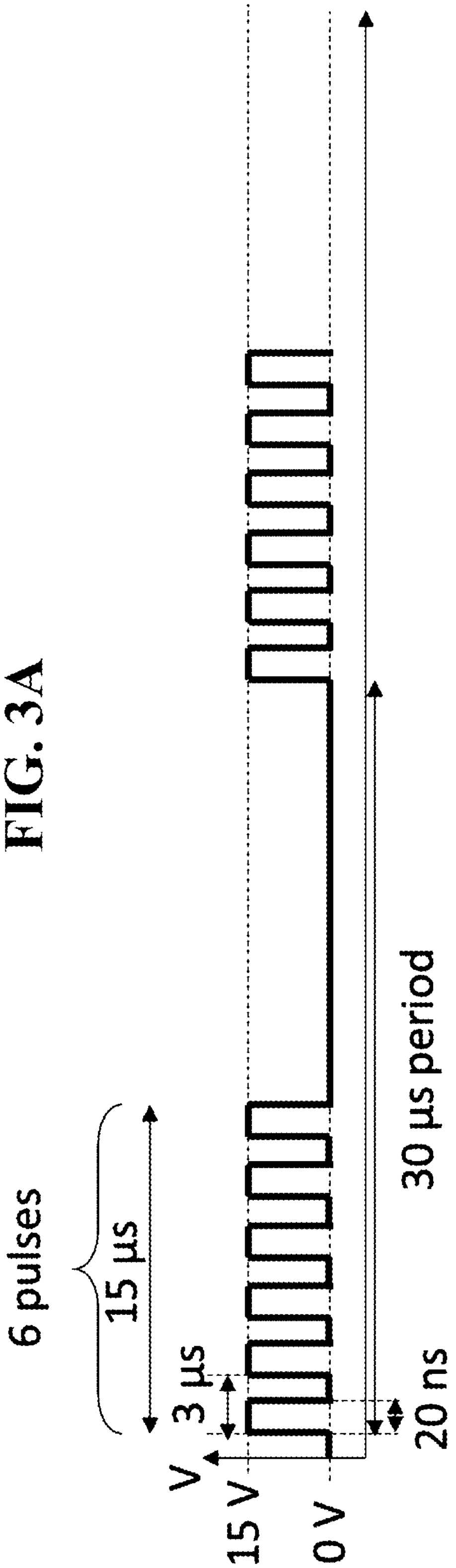

FIG. 3A illustrates a pulse pattern of 6 pulses each 50 ns in duration with a 1 μs delay between pulses for modulating a single-mode laser.

Figure 3B:
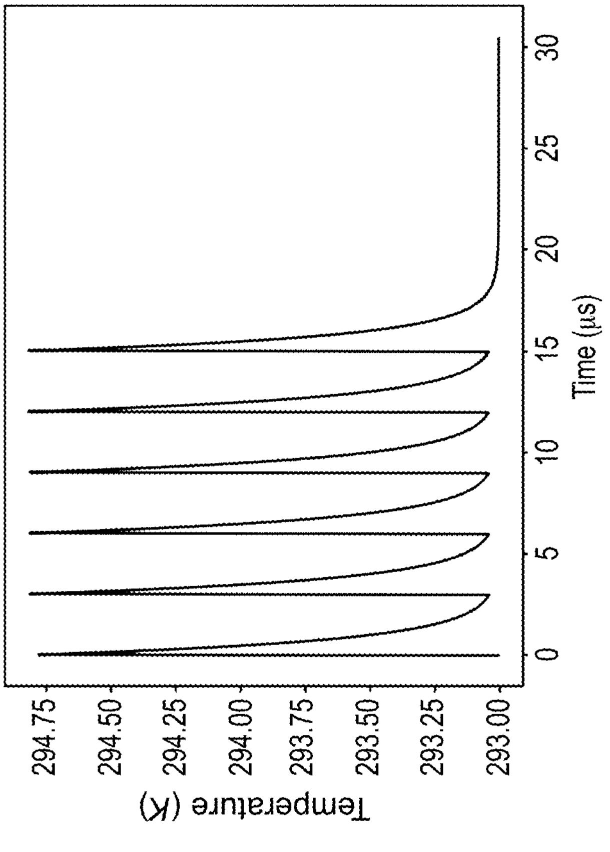

FIG. 3B illustrates temperature fluctuations in a single-mode laser modulated with the pulse pattern of FIG. 3A.

Figure 3C:
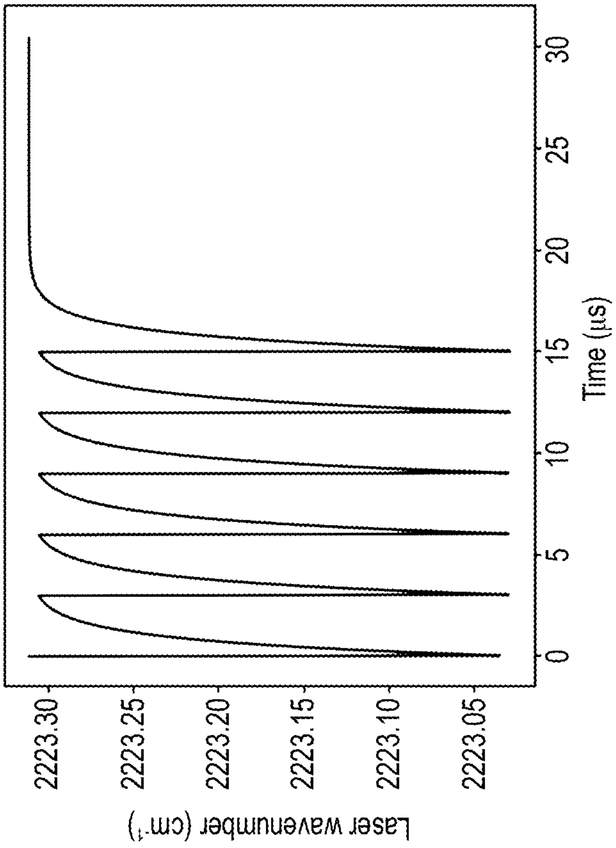

FIG. 3C illustrates wavenumbers of the laser output corresponding to the different temperatures shown in FIG. 3B.

Figure 3D:
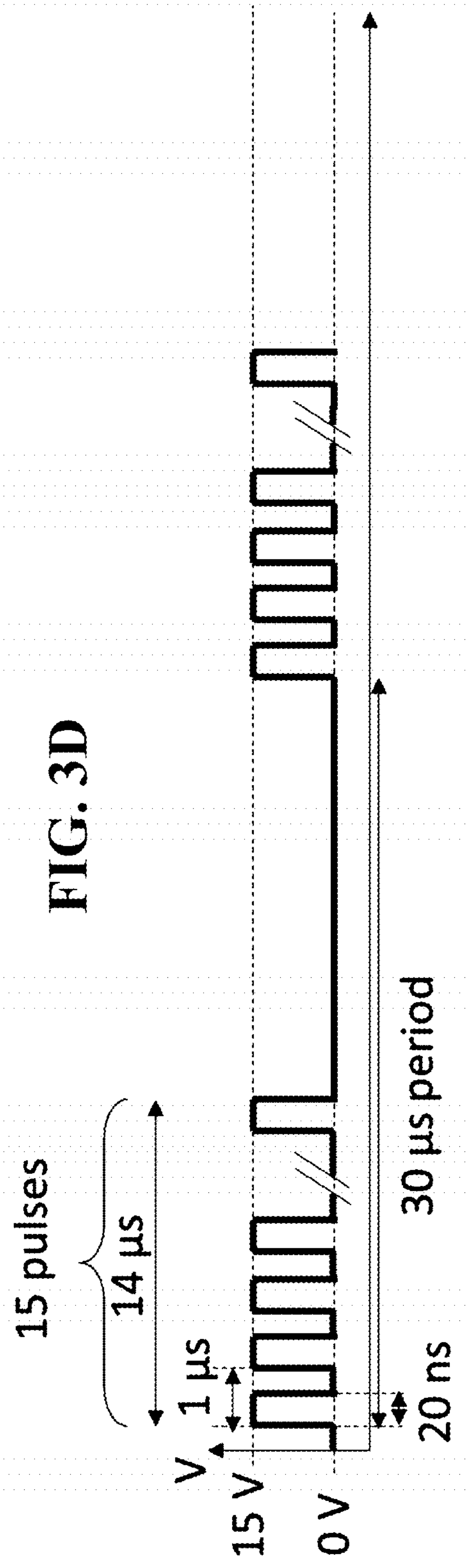

FIG. 3D illustrates a pulse pattern of 15 pulses each 20 ns in duration with a 1 μs delay between pulses for modulating a single-mode laser.

Figure 3E:
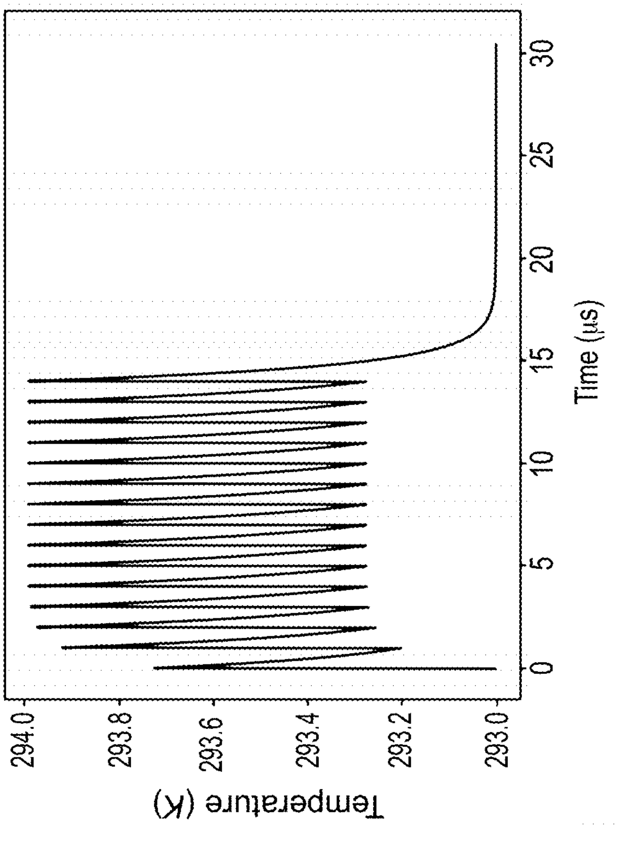

FIG. 3E illustrates temperature fluctuations in a single-mode laser modulated with the pulse pattern of FIG. 3D.

Figure 3F:
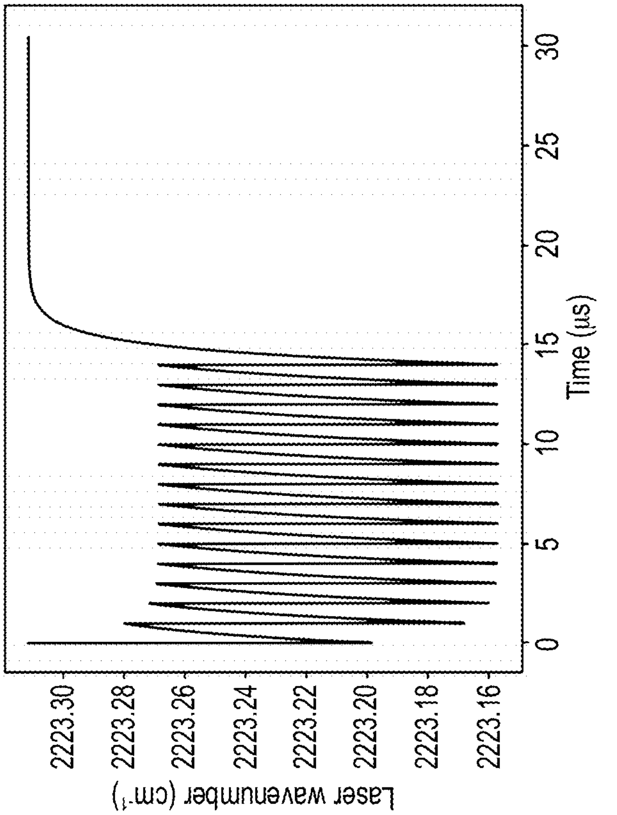

FIG. 3F illustrates wavenumbers of the laser output corresponding to the different temperatures shown in FIG. 3E.

Figure 4A:
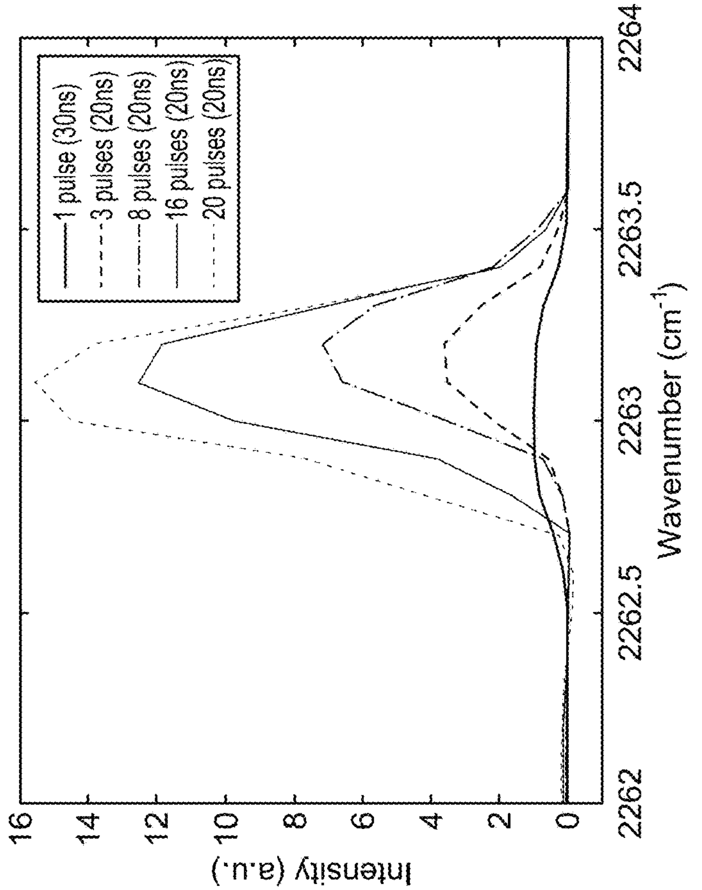

FIG. 4A is a plot of experimental emission spectra obtained for a distributed feedback QCL driven with different pulse patterns. The bias voltage is kept constant. the repetition rate of the modulation pattern is 32 kHz, and the sub-pulses are all grouped into the first 15 μs of the modulation period (~30 μs).

Figure 4B:
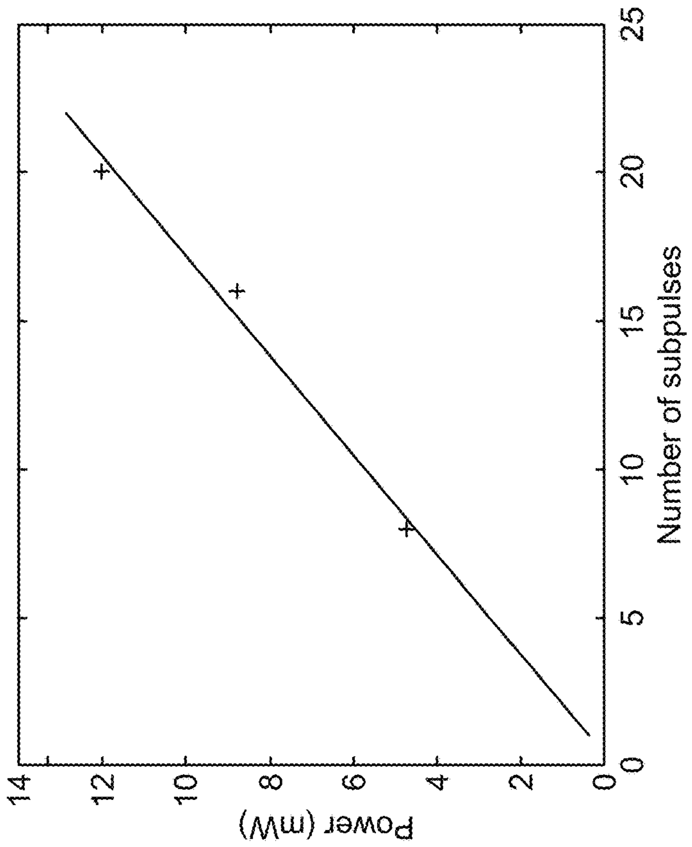

FIG. 4B is a plot of measured increase in average power with increasing number of sub-pulses (crosses). The line is a linear interpolation.

Figure 5:
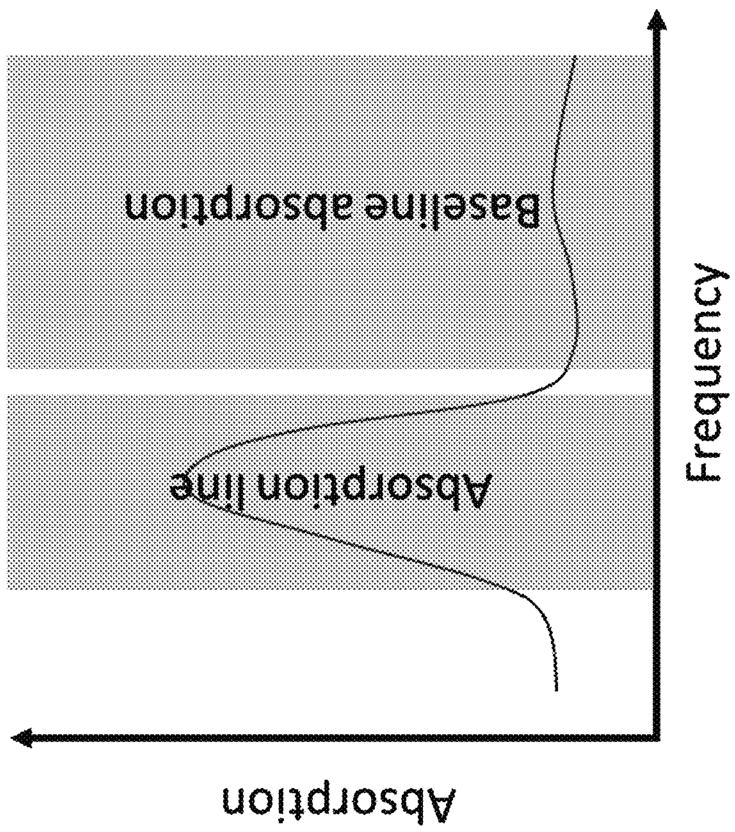

FIG. 5 illustrates an example of a typical absorption spectrum showing on-line absorption band and off-line baseline.

Figure 6A:
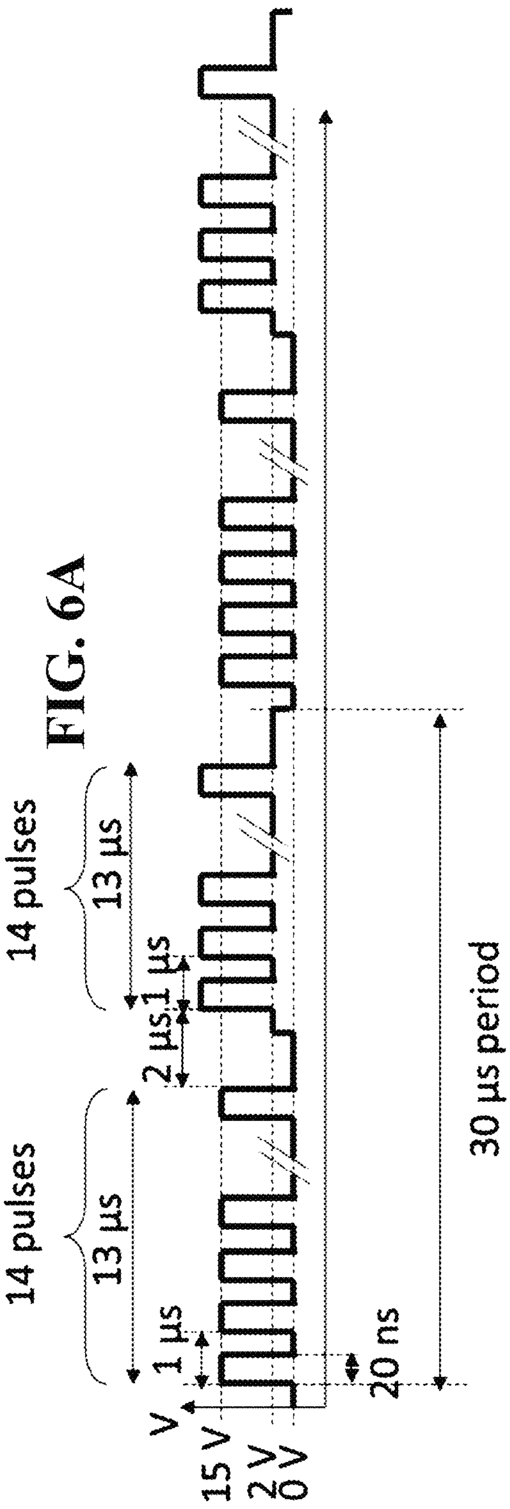

FIG. 6A is a schematic illustrating a pulse pattern for a differential spectroscopic measurement using a single-mode laser. During the first half of the period (0<t<15.2 μs), a train of 14 pulses, each 20 ns in duration and with a 1 μs delay between pulses. Then a second train of similar pulses is fired in the second half, summed in amplitude to a single 15 μs long pulse with a tenth of the amplitude of the previous pulses.

Figure 6B:
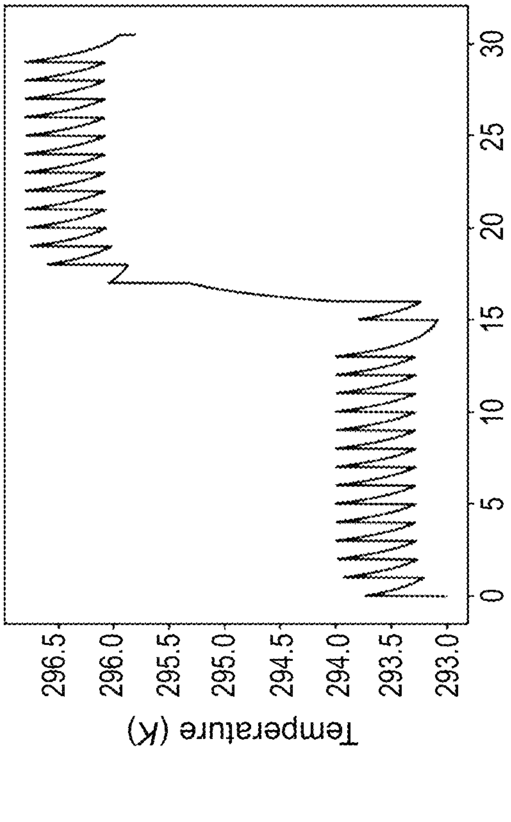

FIG. 6B is a plot of the time evolution of the laser active region temperature in response to the pulse pattern shown in FIG. 6A.

Figure 6C:
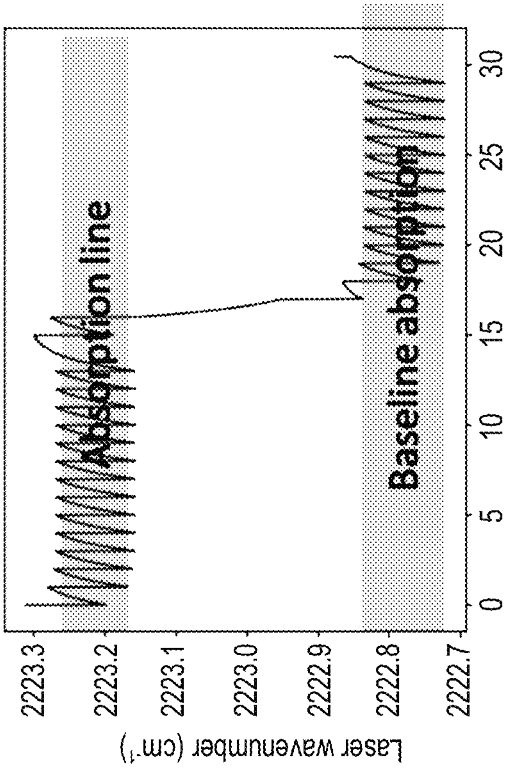

FIG. 6C is a plot of the time evolution of the laser emission wavenumber in response to the pulse pattern shown in FIG. 6A.

Figure 7A:
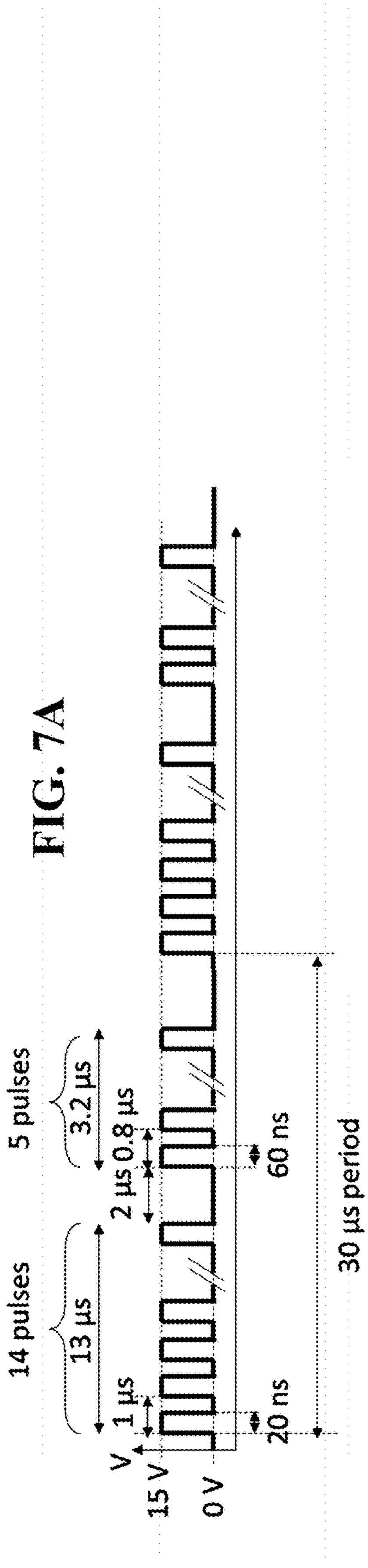

FIG. 7A is a schematic illustrating a pulse pattern for modulating a single-mode laser to make a differential spectroscopic measurement (baseline subtraction). The modulation is as follows: during the first half of each period (0<t<15.2 μs) of the 32.8 kHz periodic pattern, a train of 14 pulses, each 20 ns in duration and with a 1 us delay between pulses is used, followed by a train of 5 pulses, each 60 ns in duration and with a 0.8 μs delay between pulses, during the second half period. All pulses have the same amplitude.

Figure 7B:
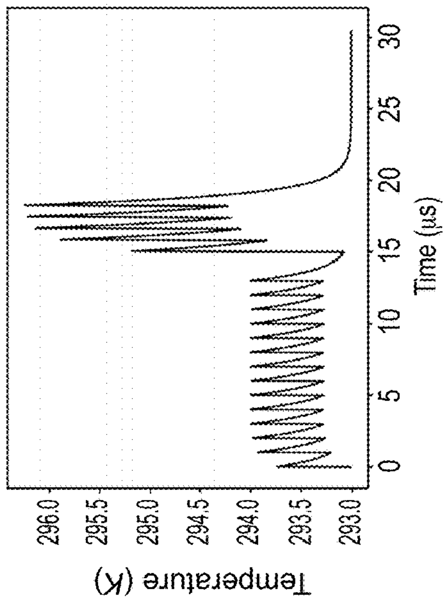

FIG. 7B shows expected temperature fluctuations of the laser's active region in response to the pulse pattern in FIG. 7A.

Figure 7C:
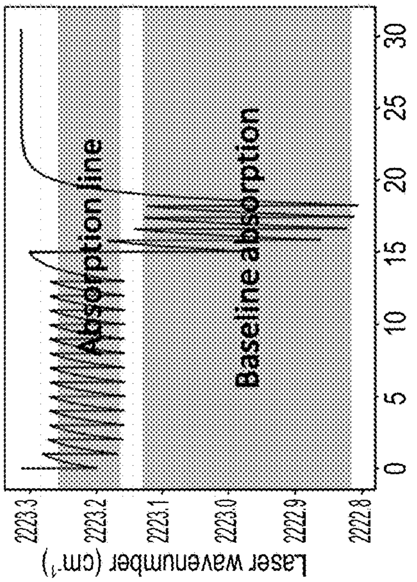

FIG. 7C shows wavenumbers corresponding to the different temperatures in FIG. 7B.

Figure 7D:
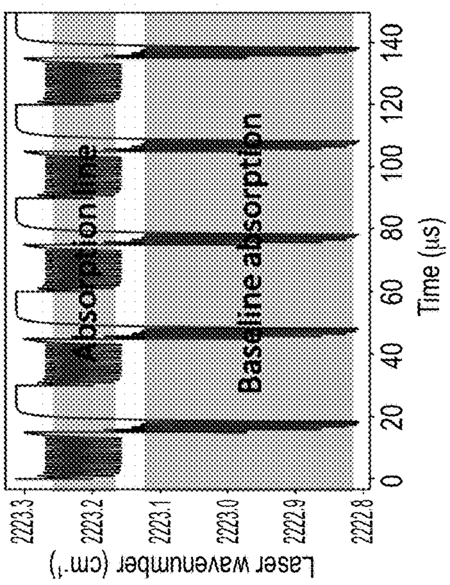

FIG. 7D shows a few cycles of the modulation of FIG. 7A, repeated with a 30 μs period.

Figure 8A:
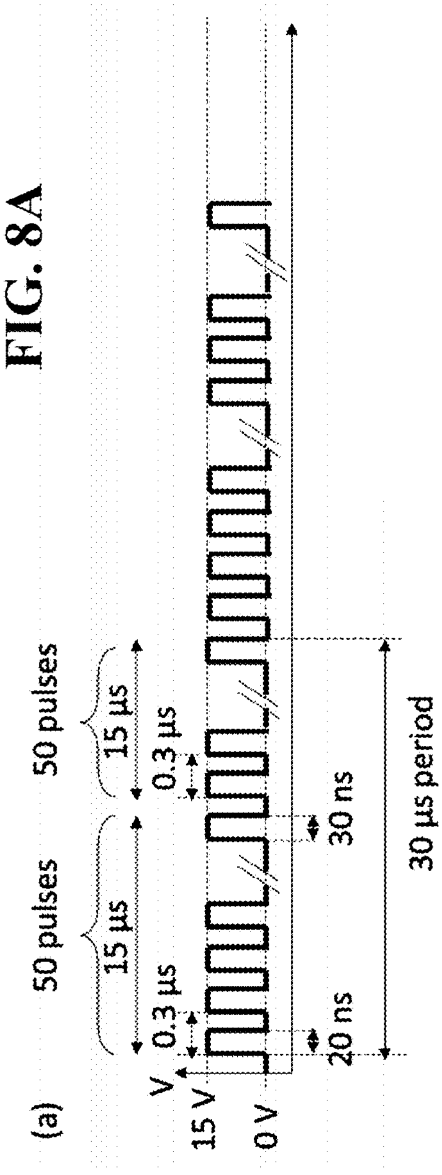

FIG. 8A is a schematic illustrating another pulse pattern for a differential measurement (baseline subtraction). The modulation is as follow: during the first half of each period ($0<t<15.2$ μs) of the 32.8 kHz periodic pattern, a train of 50 pulses, each 20 ns in duration and with a 280 ns delay between pulses is used, followed by a train of 50 pulses, each 30 ns in duration and with a 270 ns delay between pulses, during the second half period.

Figure 8B:
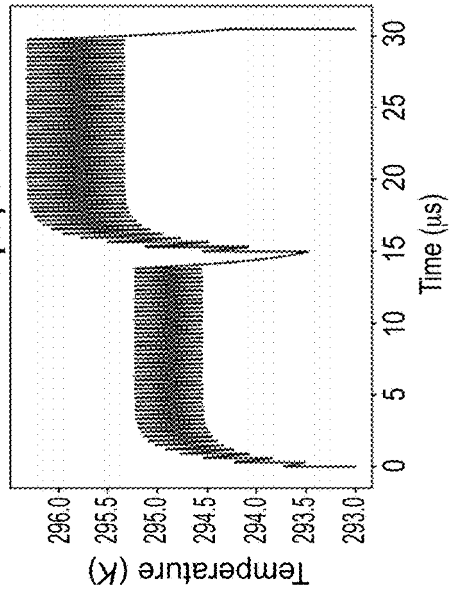

FIG. 8B shows expected temperature fluctuations of the laser's active region in response to the pulse pattern in FIG. 8A.

Figure 8C:
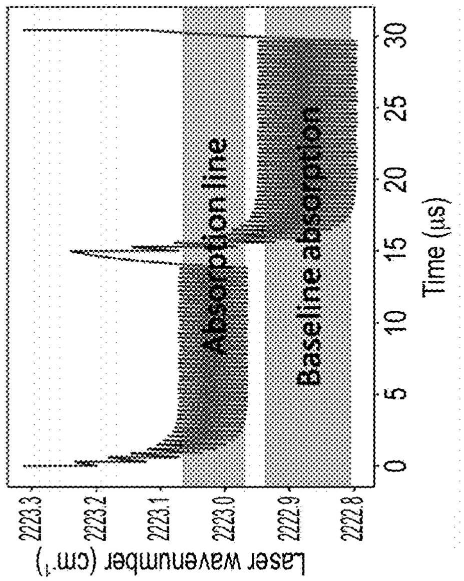

FIG. 8C shows wavenumbers corresponding to the different temperatures in FIG. 8B.

Figure 8D:
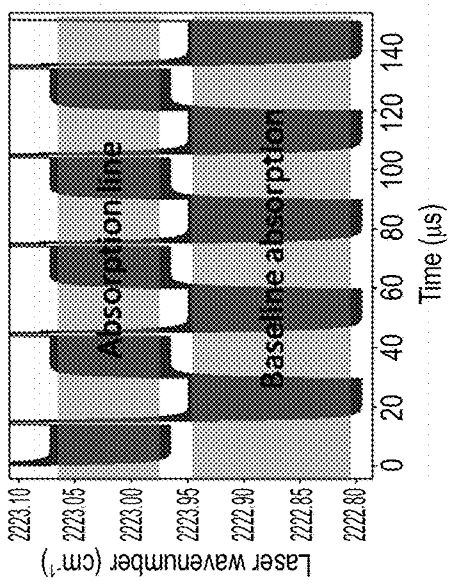

FIG. 8D shows a few cycles of the modulation of FIG. 8A, repeated with a 30 μs period.

Figure 9B:
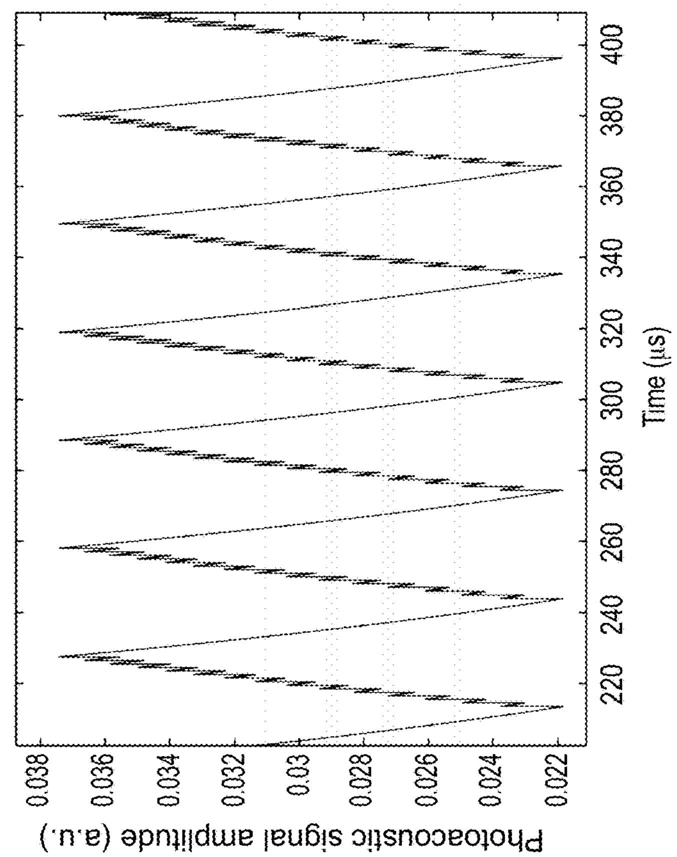
Figure 9A:
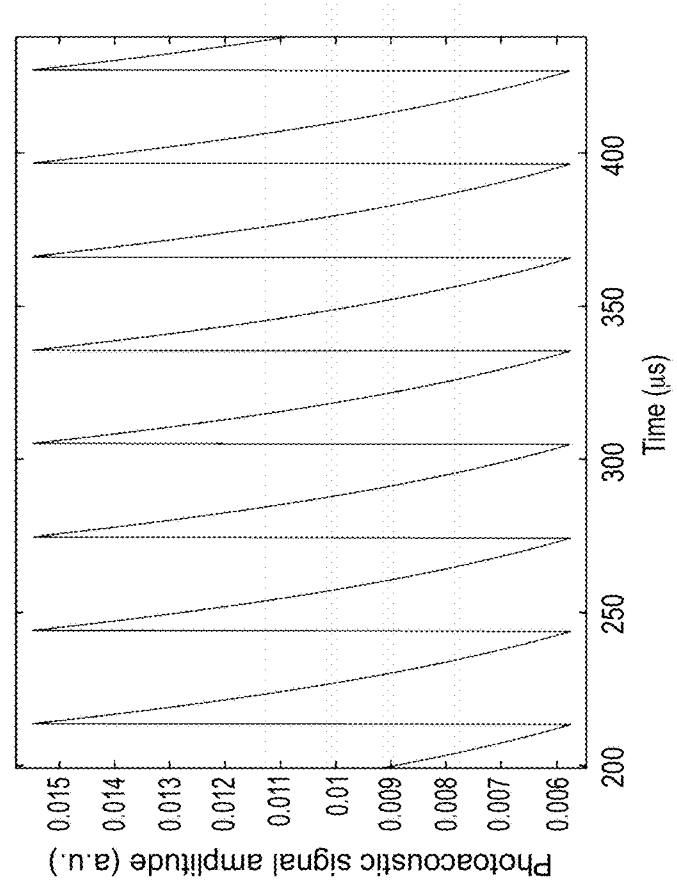

FIG. 9A shows a simulation of an acoustic waveform excited by the absorption of a laser modulated with a single 300 ns long pulse per period and a pulse repetition rate of 32.8 kHz modulation, assuming a vibrational-translational relaxation time constant for the gas analyte of 30 μs.

Figure 10B:
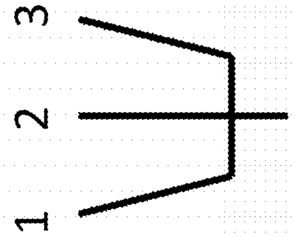
Figure 10C:
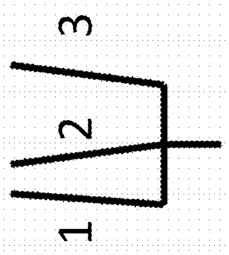
Figure 10A:
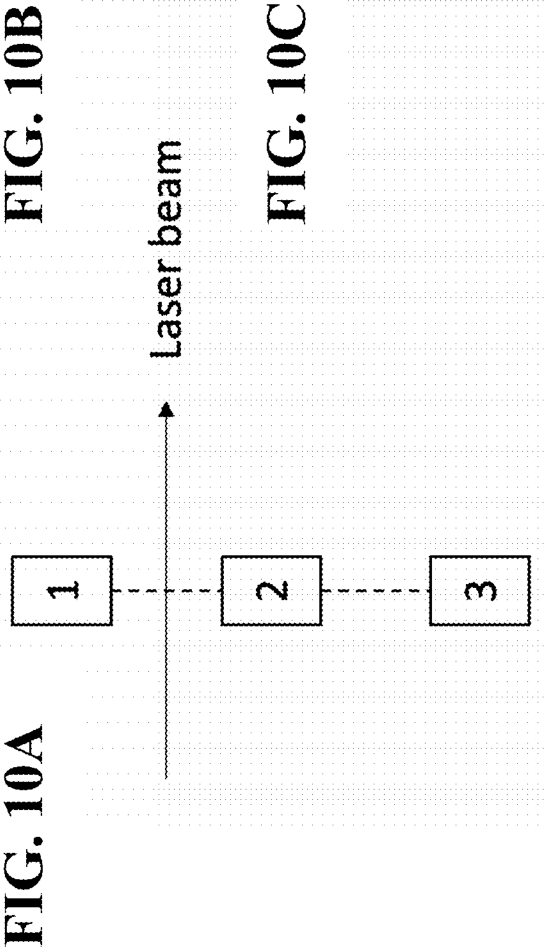

FIG. 9B shows an acoustic waveform obtained with a laser modulated with a train of 15 pulses, each 60 ns in duration and fired during the first half of the modulation period for a 32.8 kHz pulse repetition rate FIGS. 10A-10C illustrate how a three-prong tuning fork generates an acoustic wave in response excitation by a laser in quartz-enhanced photoacoustic spectroscopy (QEPAS).

Figure 11:
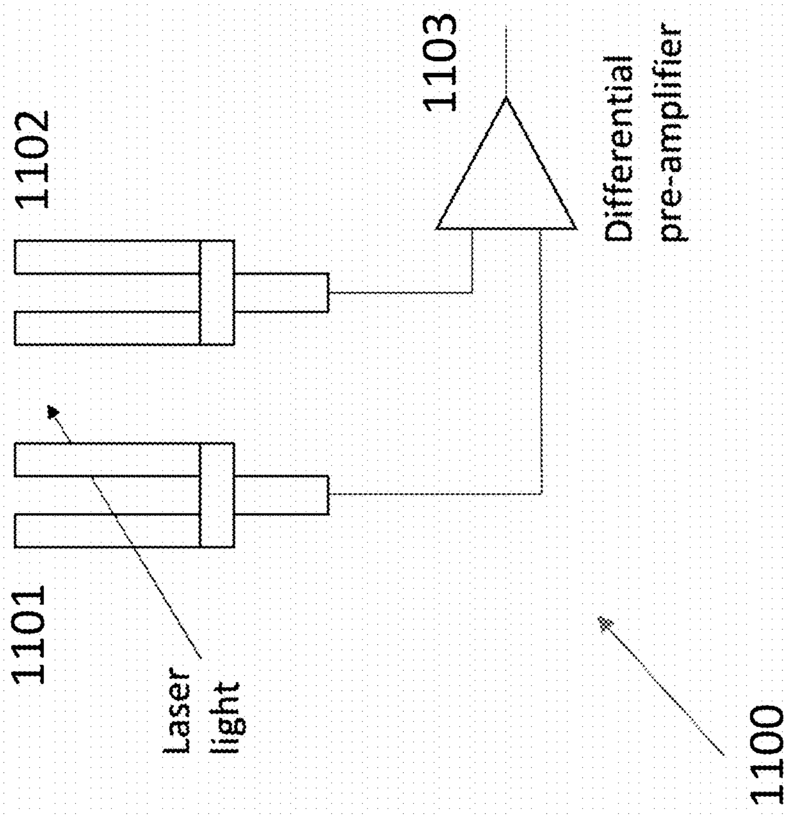

FIG. 11 is a schematic of a QEPAS setup using two tuning forks wired in such a way as to subtract the electrical signals generated by each tuning fork.

Figure 12:
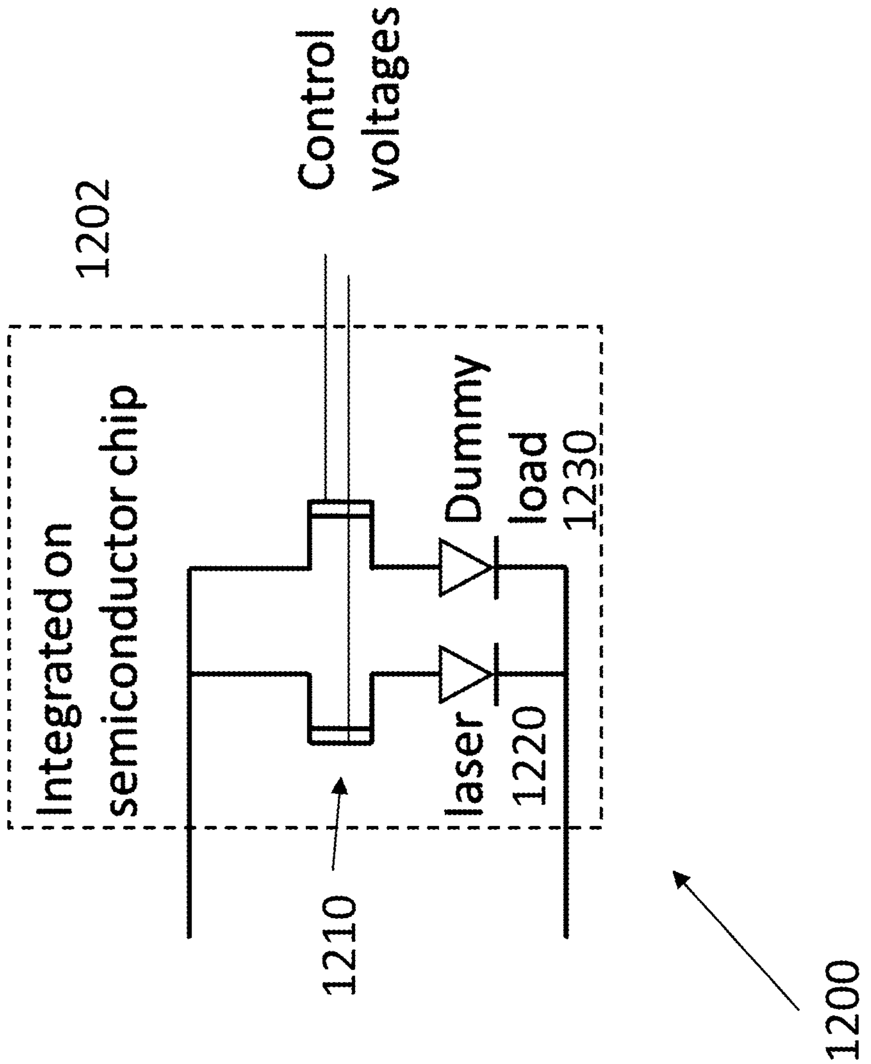

FIG. 12 is a schematic of circuitry that performs electromagnetic pick-up noise subtraction. A switch, realized, for example, with transistors directly defined on the semiconductor laser chip (e.g., indium phosphide in the case of quantum cascade lasers), can allow for the alternative drive of the laser source and of a dummy load with similar electrical characteristic than the laser, located in close proximity to the laser, on the same chip.

Figure 13:
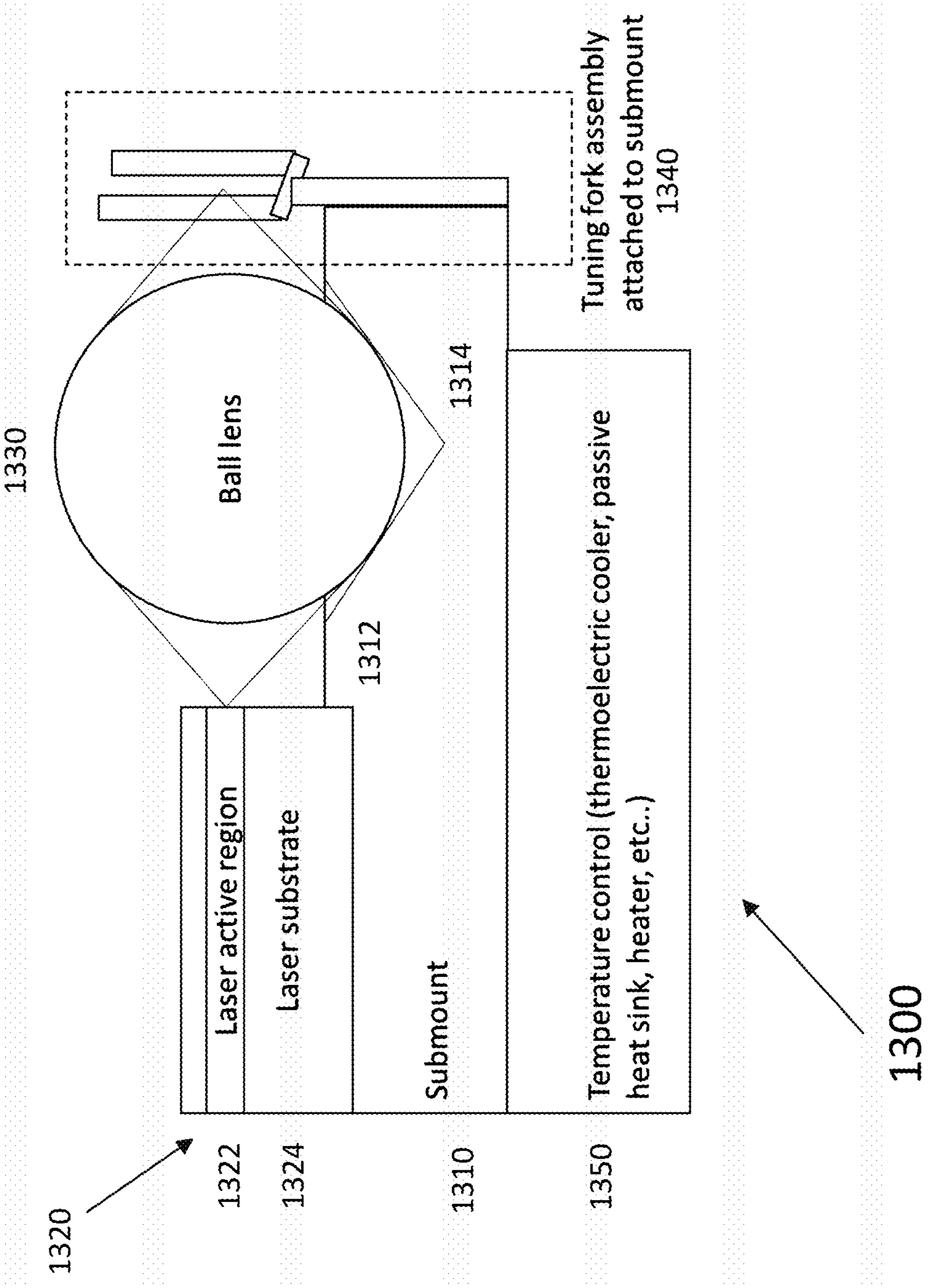

FIG. 13 is a schematic of a QEPAS device that can use the pulse patterns shown in the preceding figures.

Figure 14:
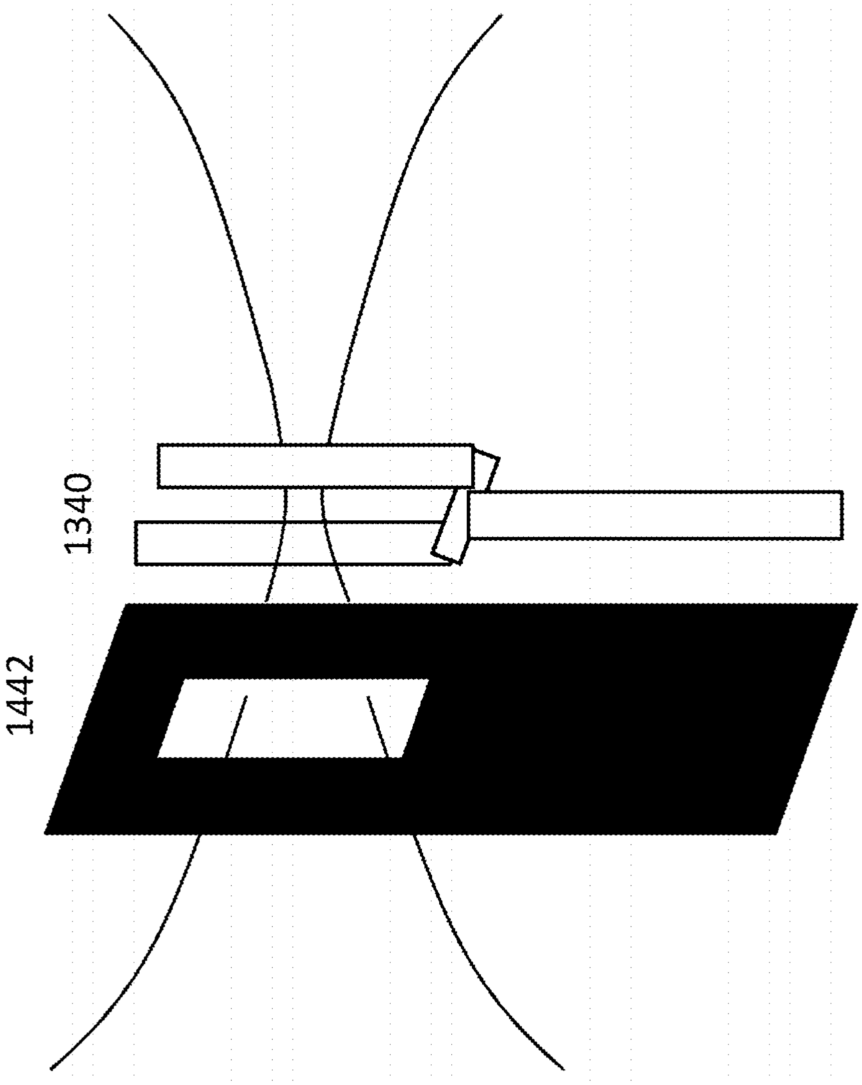

FIG. 14 is a schematic showing the use of an aperture for spatial filtering with a tuning fork for a QEPAS measurement.

FIGS. 15A-15I illustrate geometries for QEPAS devices based on edge-emitting semiconductor lasers. All schematics show the device seen from the top. The laser epi layers are in the plane of the schematic. The tuning fork prongs are represented as two crossed rectangles.

Figure 16A:
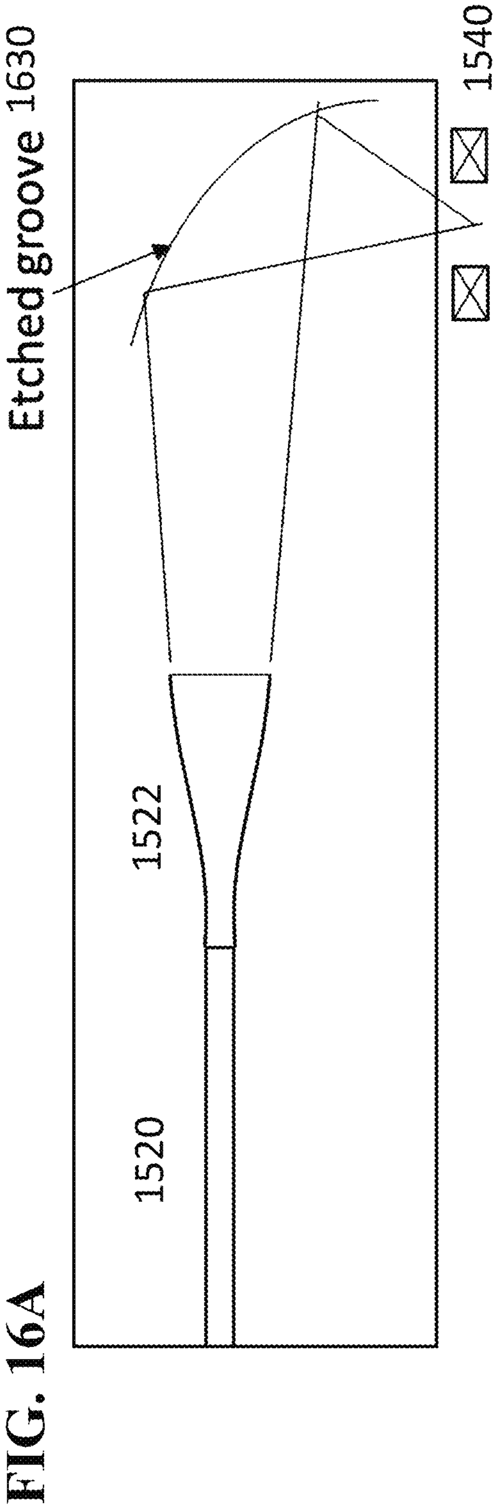
Figure 16B:
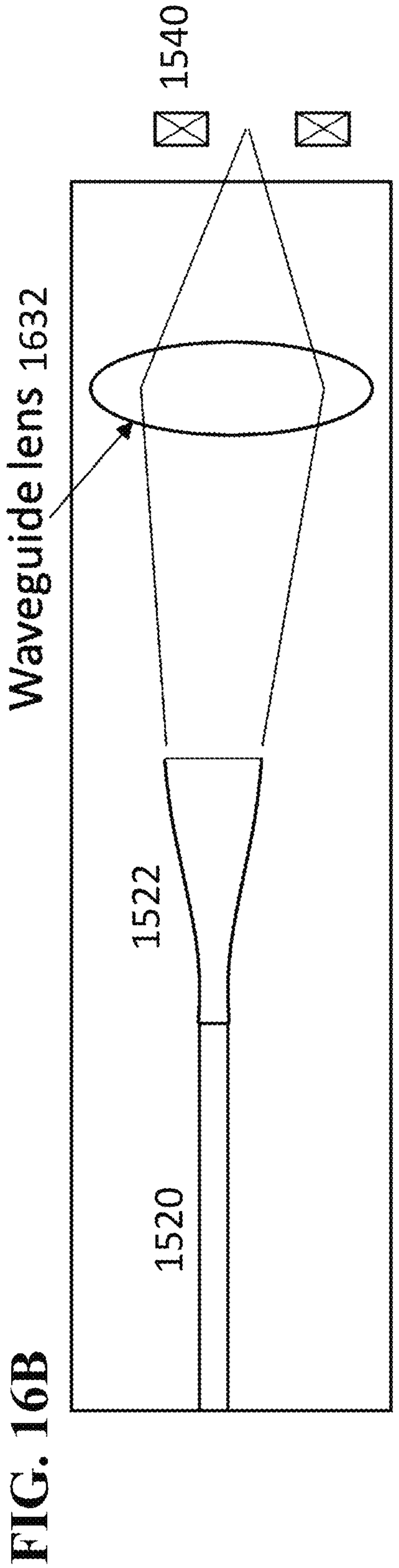

FIGS. 16A and 16B are schematics showing the use of on-chip optical elements to image the laser facet onto a point located between the tuning fork prongs.

Figure 17A:
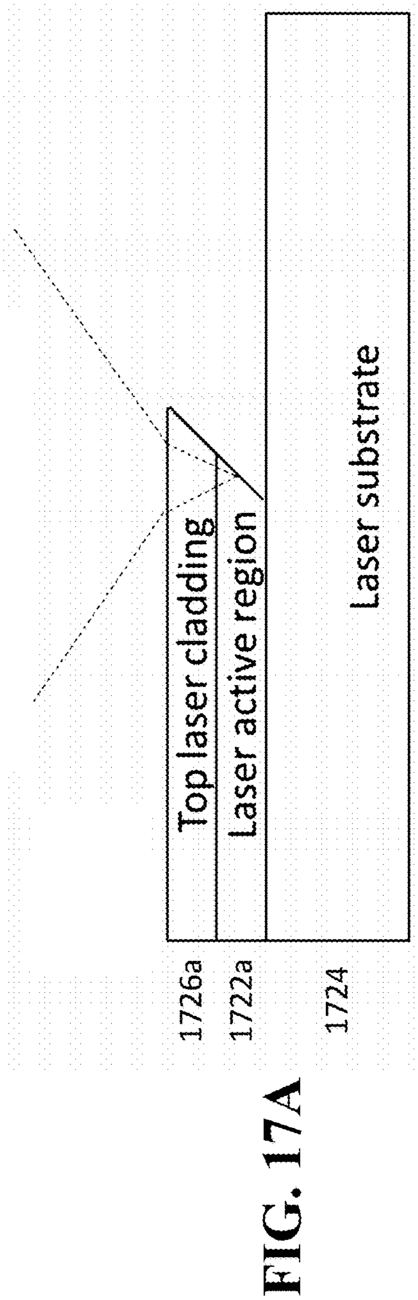
Figure 17B:
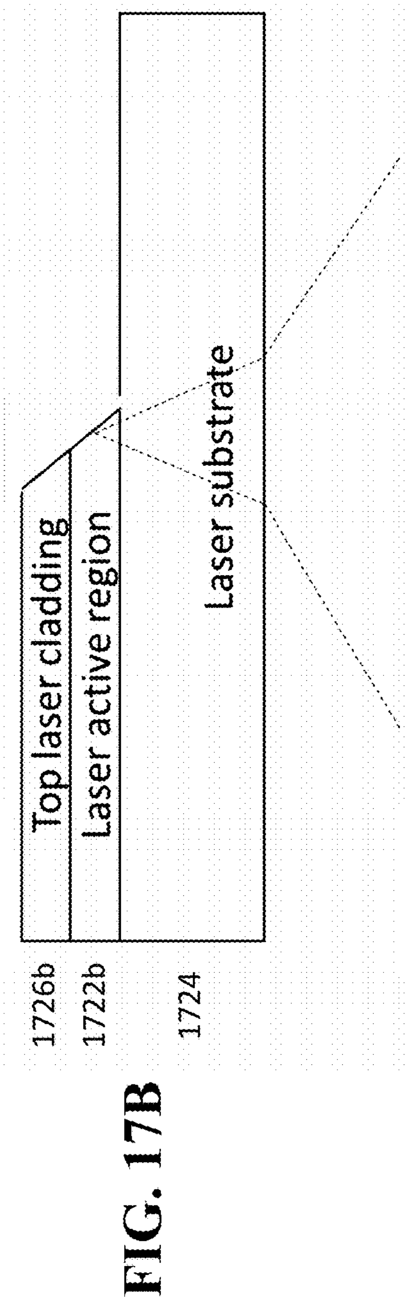
Figure 17C:
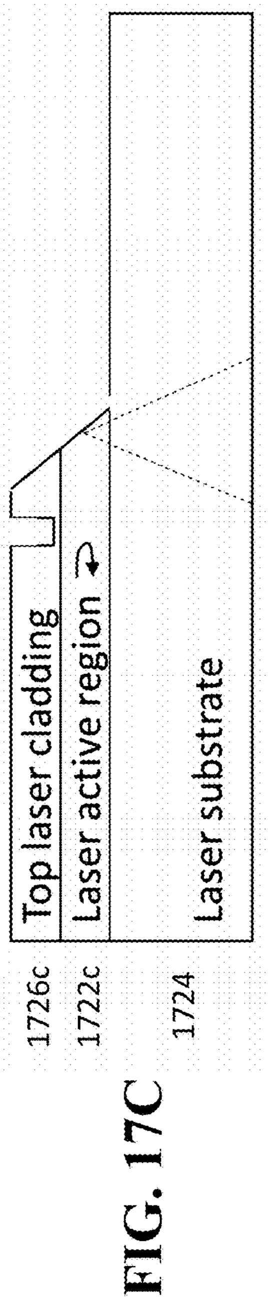

FIGS. 17A-17C show different QEPAS device configurations using surface-emitting lasers.

Figures 18A, 18B:
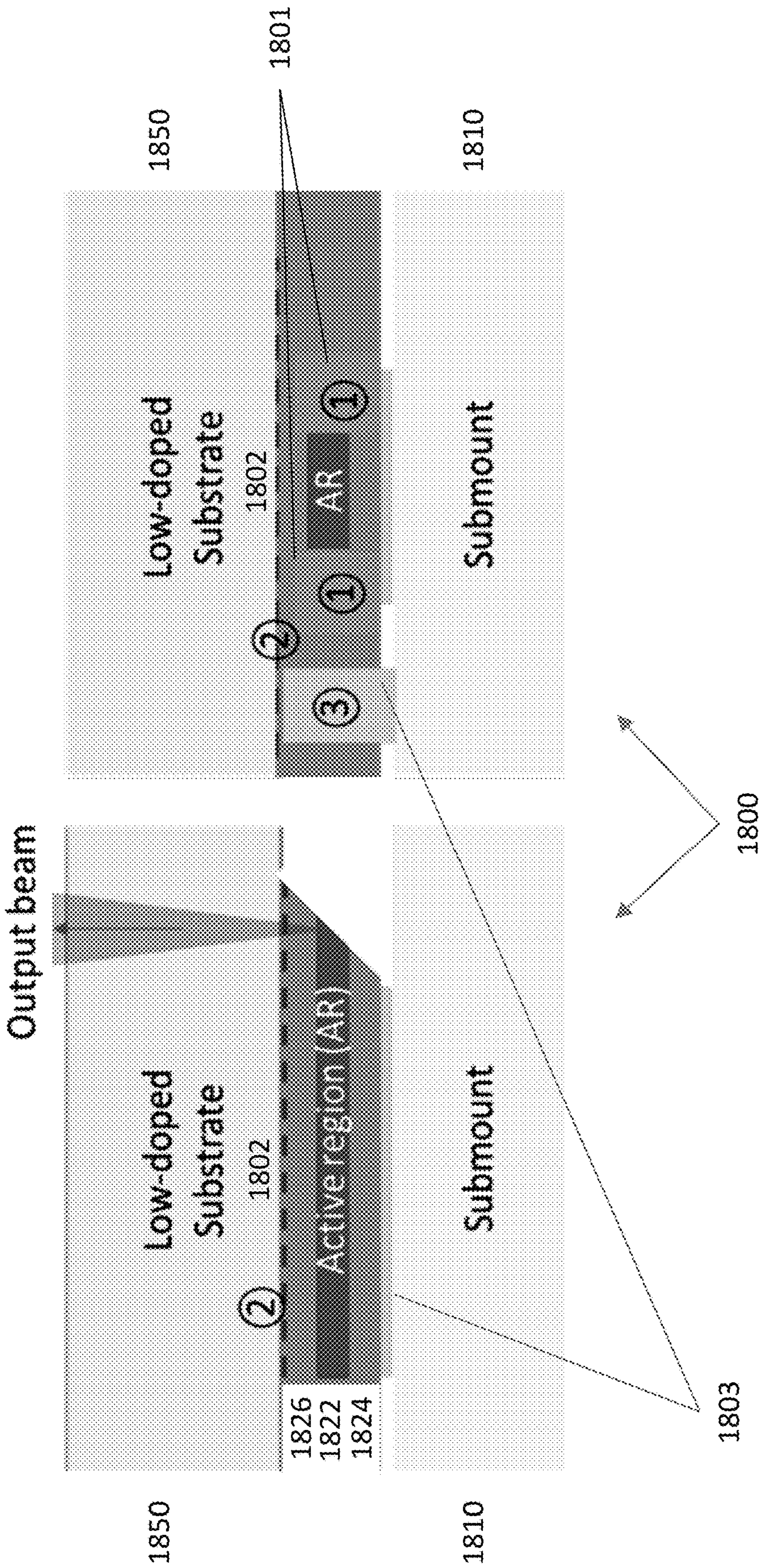

FIGS. 18A and 18B show side and front views, respectively, of a laser architecture with a substrate emitting laser.

Figure 19:
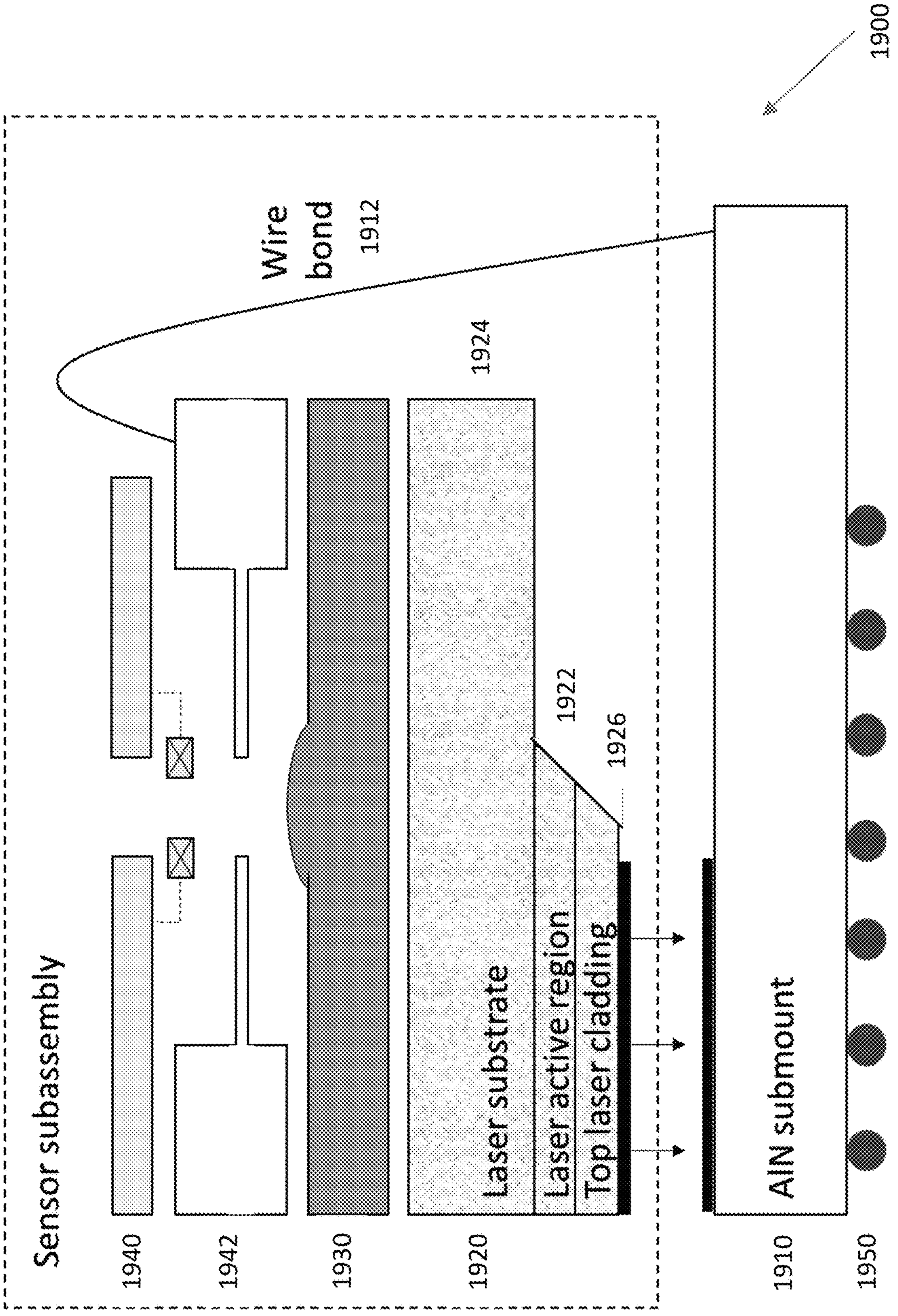

FIG. 19 shows an exploded view of an integrated QEPAS sensor (subassembly) with a laser source, optical element, aperture and tuning fork.

Figure 20:
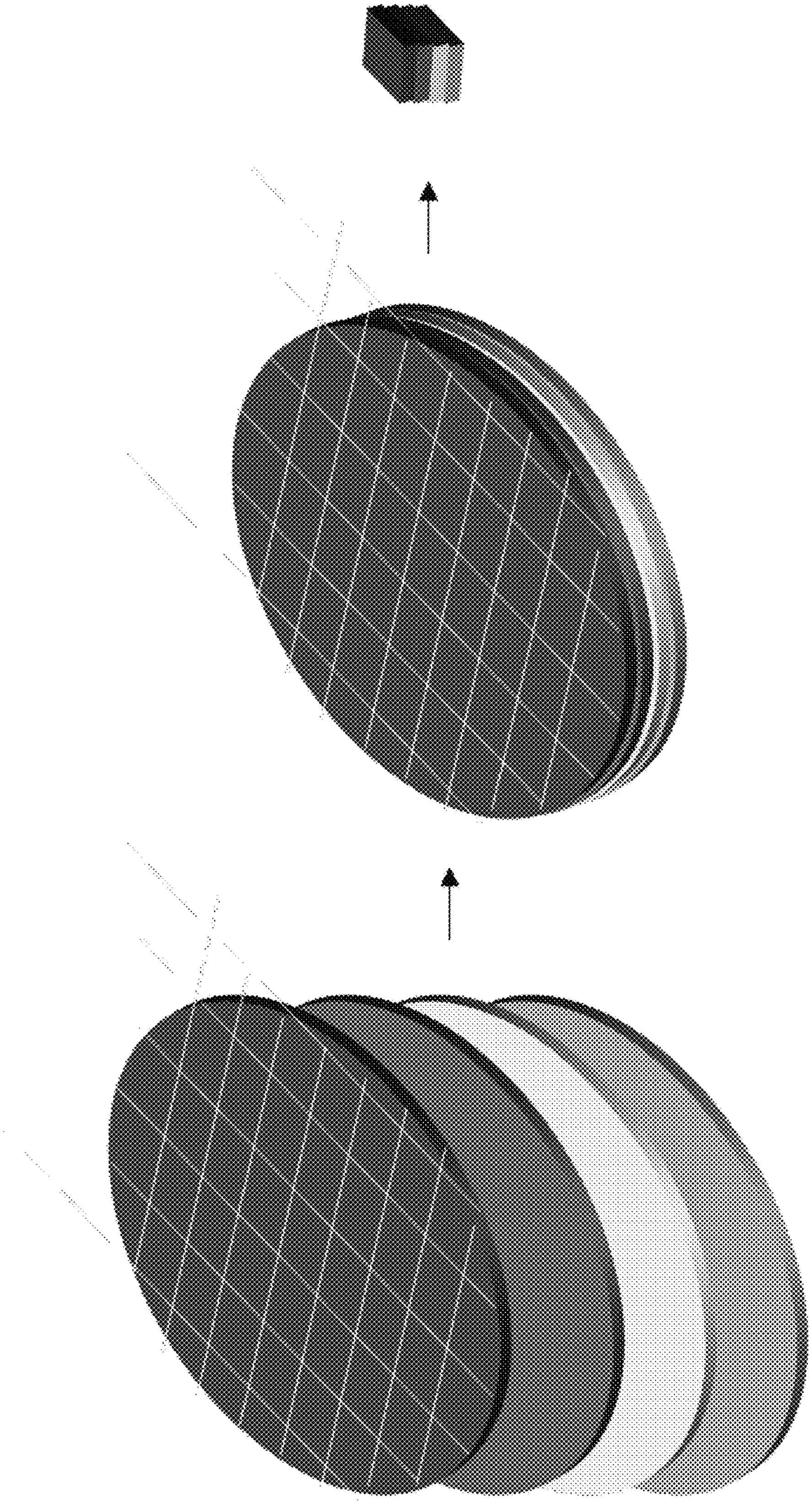

FIG. 20 illustrates a wafer-bonding process suitable for making an integrated QEPAS sensor like the one shown in FIG. 20, whereby the different functionalities are merged into a single subassembly by bonding wafers with two-dimensional arrays of lasers, lenslet arrays, apertures, and tuning forks.

FIGS. 21A-21D show a set of geometries based on surface-emitting semiconductor lasers. All schematics show the device seen from the side (cross section along the length of the lasers). The tuning fork prongs are represented as two crossed rectangles in FIGS. 21B-21D.

DETAILED DESCRIPTION

The devices and methods presented here address issues related to the use of semiconductor lasers as a source of light for a PAS spectrometer. For example, when using a pulsed distributed-feedback (DFB) quantum cascade laser (QCL) emitting in the infrared spectral range, the heating of the QCL's active region during the pulse duration (on the scale of a few nanoseconds to a few microseconds) leads to a change of the refractive index and consequently a chirp of the emitted laser light (i.e., a change of frequency versus time). For a pulse duration on the order of a few hundred nanoseconds, that chirp is typically on the order of 1 to 3 $cm^{-1}$, although this value can be made smaller or larger based on the heat dissipated in the QCL's active region. For example, a laser with high doping of the active region typically draws more current and thus dissipates more heat, leading to a larger chirp rate. The efficiency of the active region and thus the amount of heat it generates for a given input electrical power can also be adjusted by proper band-structure engineering.

Chirping due to temperature changes reduces the efficiency of a PAS measurement because gas absorption lines, even at ambient conditions of temperature and pressure, are typically narrower than the chirp bandwidth. To see why, consider a gas line with an absorption linewidth of $\Delta v_{gas}$ (which may be smaller than 1 $cm^{-1}$) and a laser that chirps over $\Delta v_{chirp}$ during the duration of the electrical driver pulse $\tau$, where we assume that $\Delta v_{chirp}>\Delta v_{gas}$ and that $\Delta v_{chirp}$ encompasses the full absorption linewidth. The effective time during which the laser light is absorbed by the analyte is thus on the order of $(\Delta v_{gas}/\Delta v_{chirp})\tau$. In other words, only a fraction $\Delta v_{gas}/\Delta v_{chirp}$ of the laser energy contributes to the generation of the photoacoustic signal, the remainder being wasted.

This observation is generalizable to other spectroscopic techniques employing slow detectors, in which an average quantity is measured. A slow detector refers here to a detector with a time constant larger than the typical time it takes a pulsed laser to chirp through a gas line. For example, for infrared spectroscopy based on pulsed quantum cascade lasers, a detector with a time constant larger than 1 microsecond can be considered slow since such detector may not be able to resolve the absorption dip as the laser chirps through a gas line during a single pulse. Note that other elements of the system (e.g., the pre-amplifier or the digitizer) may limit the bandwidth and that the overall system response speed should be considered. When a slow detector is used, the quantity measured is typically the total amount of light absorbed by the gas over the pulse duration, measured indirectly via the amplitude of the consequently generated acoustic wave for PAS, or directly as a transmission dip in more typical infrared absorption spectroscopy. In these cases, only a fraction $\Delta v_{gas}/\Delta v_{chirp}$ of the laser energy contributes to the generation of information.

Another spectroscopic technique using a slow, resonant detector is the use of a mechanical resonator as a light detector. A mechanical resonator, for example, a quartz tuning fork, can be excited by photothermal effects when the radiation impinging on the resonator material is partially absorbed by the material, leading to a local heating of the material and consequent strain. The photoelectric effect may also result in the creation of surface charges when the light is impinging on the resonator material, which may in turn strain the material if the material has a significant piezo-electric coefficient. The techniques described here, aimed at increasing or maximizing signal strength and mitigating background signal and noise in QEPAS, also apply to most techniques employing slow detectors, such as the resonant thermomechanical technique described in this paragraph.

High Frequency Modulation

It is usually assumed by QEPAS practitioners that the modulation frequency should be similar or slower than the analyte vibrational-translational relaxation time, which acts as a low-pass for the photoacoustic signal. However, there are several advantages to using modulations faster than the analyte vibrational-translational relaxation time:

(1) A fast modulation can be used to increase the effective duty cycle of the measurement. As mentioned above, long laser pulses lead to larger intra-pulse chirp range. When $\Delta v_{chirp} > \Delta v_{gas}$, which is commonly the case, increasing the laser pulse duration does not lead to an increase in signal since it increases the chirp range $\Delta v_{chirp}$. In other words, the laser is not exciting the gas molecules during that extra duration. Increasing the modulation frequency (i.e., decreasing the pulse repletion period) at constant pulse width thus leads to a proportional increase of energy transferred to the gas per unit of time, resulting in an increase of acoustic signal generated per unit of time proportionally to the modulation frequency.

(2) A fast modulation can help isolate the generated acoustic signal from ambient noise and 1/f noise. To see how a modulation faster than the analyte vibrational-translational relaxation time can be used, consider a measured photoacoustic signal S that is proportional to $a(f)*P_{average}*Q$, where a(f) is a factor representing the efficiency of the acoustic wave generation for a modulation at frequency f, $P_{average}$ is the laser average power (proportional to f if the pulse width is fixed), and Q is the fork quality factor. The effect of the limited V-T relaxation time is similar to that of a first order low-pass filter, resulting in a coefficient a(f) approximately proportional to 1/f. Consequently, when increasing the modulation frequency fin an experiment involving pulsed lasers with $\Delta v_{chirp} > \Delta v_{gas}$, the photoacoustic signal is approximately conserved. However, the fast frequency operation can enable easier frequency-based filtering from ambient noise, 1/f noise, etc.

PAS with Pulsed Semiconductor Lasers

Quantum cascade lasers (QCLs) are often used as sources of light in QEPAS spectrometer since they can emit light in the mid-wave and long-wave infrared regions (3-16 μm) and beyond in the terahertz spectral range. These spectral ranges are relevant for analytical chemistry since many molecules have unique absorption features (such as sharp absorption lines) corresponding to the excitation of ro-vibrational modes of the molecules. Measuring a spectrum containing these features can allow for the identification and quantification of these molecules.

Most QEPAS experiments to date using QCLs use continuous wave (CW) devices that emit light continuously for at least the duration of the measurement. In contrast to pulsed QCLs, CW-QCLs require good thermal dissipation, with design implications from the package to the laser waveguide level, driving constraints for system weight, size, power consumption, manufacturing cost, and laser fabrication yield. These lasers are also usually on the order of ten times less efficient at converting electrical power into optical power than pulsed QCLs. It can thus be advantageous to use pulsed QCLs in situations that benefit from small size, weight, power, and cost. Furthermore, since the frequency tuning obtained with the intra-pulse chirp of pulsed lasers is an intrinsic effect that does not require additional components or control, pulsed QCLs provide a faster, simpler and potentially more accurate solution than the typical current or temperature ramps used in the frequency tuning of CW lasers.

We present here processes that can be used to optimize the amount of acoustic energy generated from the gas absorption of the laser light, and the amplitude of the signal readout from the piezo-electric transducer. These processes include increasing the efficiency of acoustic signal generation by increasing the time during which the laser is on and the frequency of its emitted light overlaps the gas absorption line targeted by the measurement. They also include increasing the piezoelectric signal by (1) modulating the laser light at or close to the resonant frequency of the tuning fork; and/or (2) reducing the energy that is lost to the excitation of higher harmonics of the mechanical oscillator (unless these are also measured and contribute to the acquired signal).

Figure 1A:
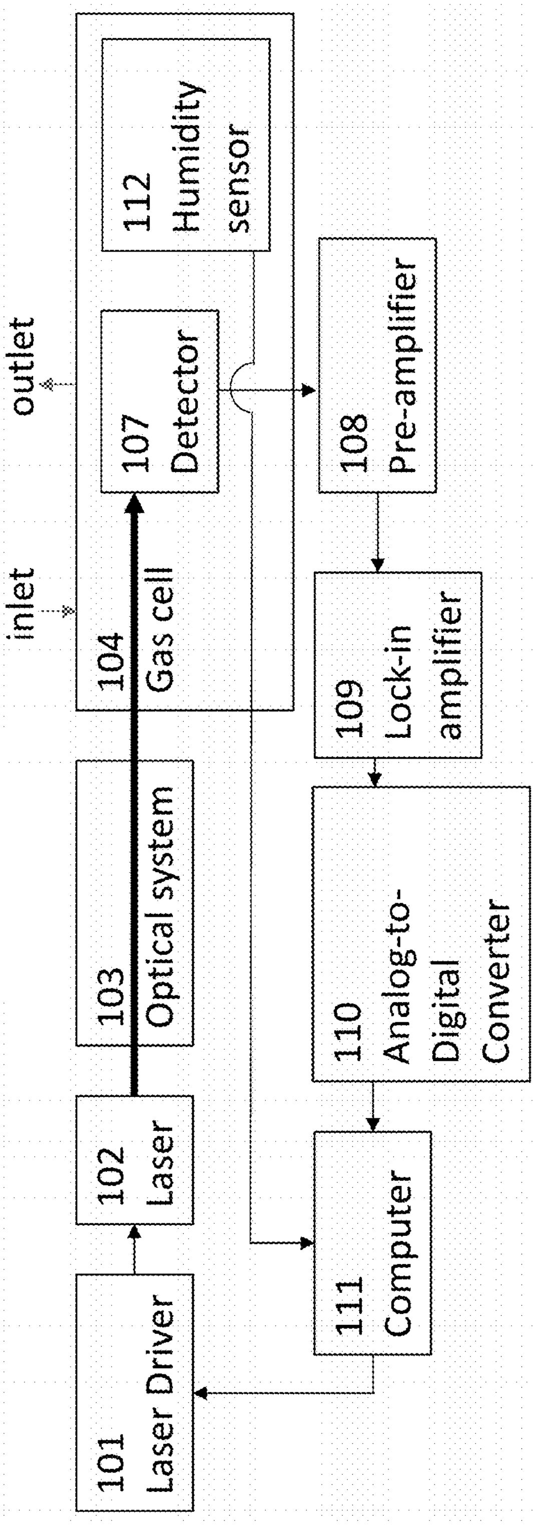
FIG. 1B is a schematic of a typical system for absorption spectroscopy. The detector is in this case typically outside of the gas cell.
FIG. 1C illustrates the different stages of signal generation for a photoacoustic spectroscopy experiment, from the laser driver waveform to the final detector output. This case represents the typical case whereby a single pulse is used to excite the acoustic wave, which in turn excites mechanical vibrations of a mechanical resonator in the detector.
FIG. 1D illustrates the different stages of signal generation for a photoacoustic spectroscopy experiment using a complex pulse pattern to generate the acoustic wave, which in turn excites mechanical vibrations of a mechanical resonator in the detector.

FIG. 1A shows a system for conducting QEPAS measurements using inventive architectures, inventive pulsed modulation schemes, or both. The system of FIG. 1A includes a laser driver 101 that applies a repetitive sequence of electrical pulses to a single-mode laser 102, such as a DFB QCL. The single-mode laser 102 emits a repetitive sequence of optical pulses in response to the repetitive sequence of electrical pulses. An optical system 103 comprising lenses, mirrors, prisms, and/or other optical components shape and direct these optical pulses to a gas cell 104 that contains a resonant detector (e.g., a quartz tuning fork 107) and an optional humidity detector 112.

In operation, an analyte gas flows into the gas cell 104 via an inlet 105 and out of the gas cell 104 via an outlet 106. The optical system 103 focuses the optical pulses between the prongs of the tuning fork 107, which may have a resonance frequency from about 1 kHz to several MHz (e.g., 32 kHz resonance). The focused optical pulses heat the analyte gas between the tuning fork prongs, which drives a pressure wave (i.e., an acoustic wave), which in turn excites the tuning fork 107. Alternatively, the optical system 103 may focus the optical pulses onto the tuning fork 107 for resonant thermomechanical spectroscopy measurements, which involve exciting the tuning fork directly with the light instead of with an acoustic wave in the gas analyte.

A pre-amplifier 108 and lock-in amplifier 109 read the tuning fork's mechanical oscillations as an electrical signal via the piezoelectric effect. (Alternatively, the tuning fork oscillations can be read optically using an interferometer or deflectometer.) An analog-to-digital converter (ADC) 110 digitizes the output of the lock-in amplifier 109 for processing by a computer 111, which uses the electrical signal and the humidity sensor's output to control the laser driver 101. Lock-in detection may also be realized in digital space: in this case, the output of the pre-amplifier is first digitized, and algorithms (e.g. Fourier transforms and digital filtering) may be used to extract the signal amplitude and phase at a specific frequency (e.g. the resonance frequency of the resonant detector).

Figure 1B:
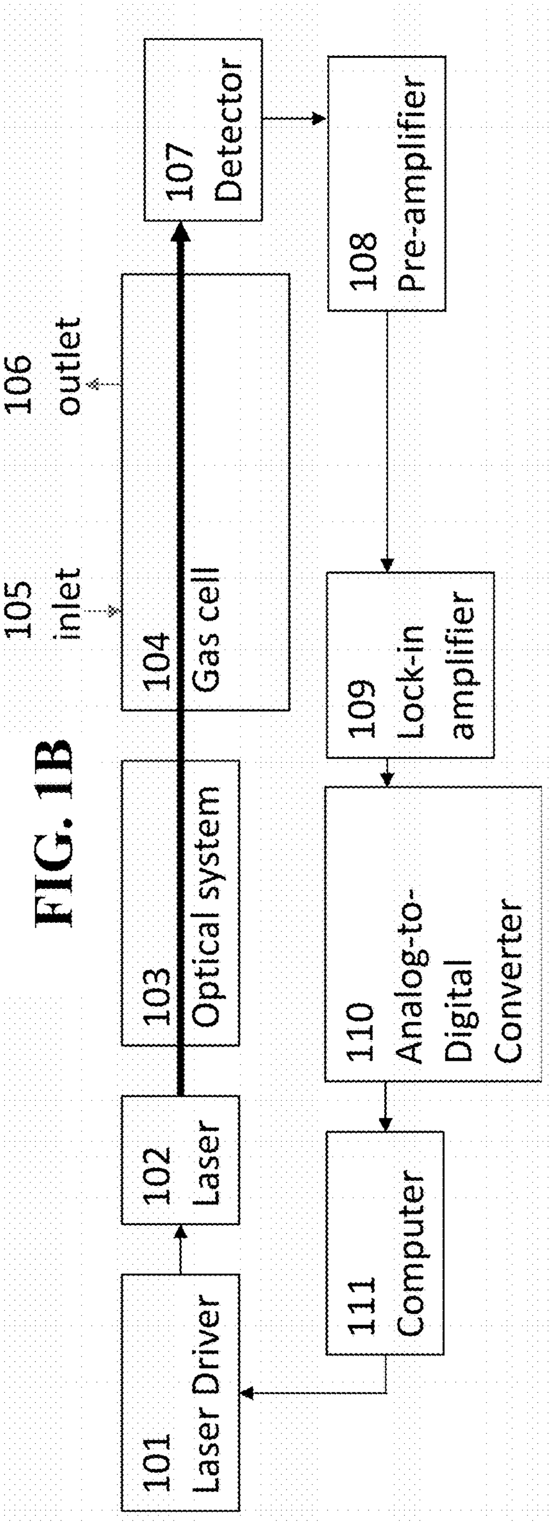

FIG. 1B shows an inventive system for absorption spectroscopy. It includes all of the same components shown in FIG. 1A, except that the detector 107 is outside of the gas cell 104. The detector in the absorption spectroscopy system of FIG. 1B can be either a resonant detector or a non-resonant detector. For instance, the detector may be a slow detector as described above. If desired, the lock-in amplifier 109 can bandpass filter the electrical signal (e.g., current or voltage) generated by the detector 107 at a band centered on the pulse repetition frequency of the electrical signal used to modulate the laser 102. (This bandpass filtering may also be accomplished with a separate analog filter or in the digital domain, e.g., with a processor.) This reduces 1/f noise and make it possible to deposit more energy in a narrow wavelength bandwidth by emitting many short optical pulses from the laser 102.

Figure 1C:
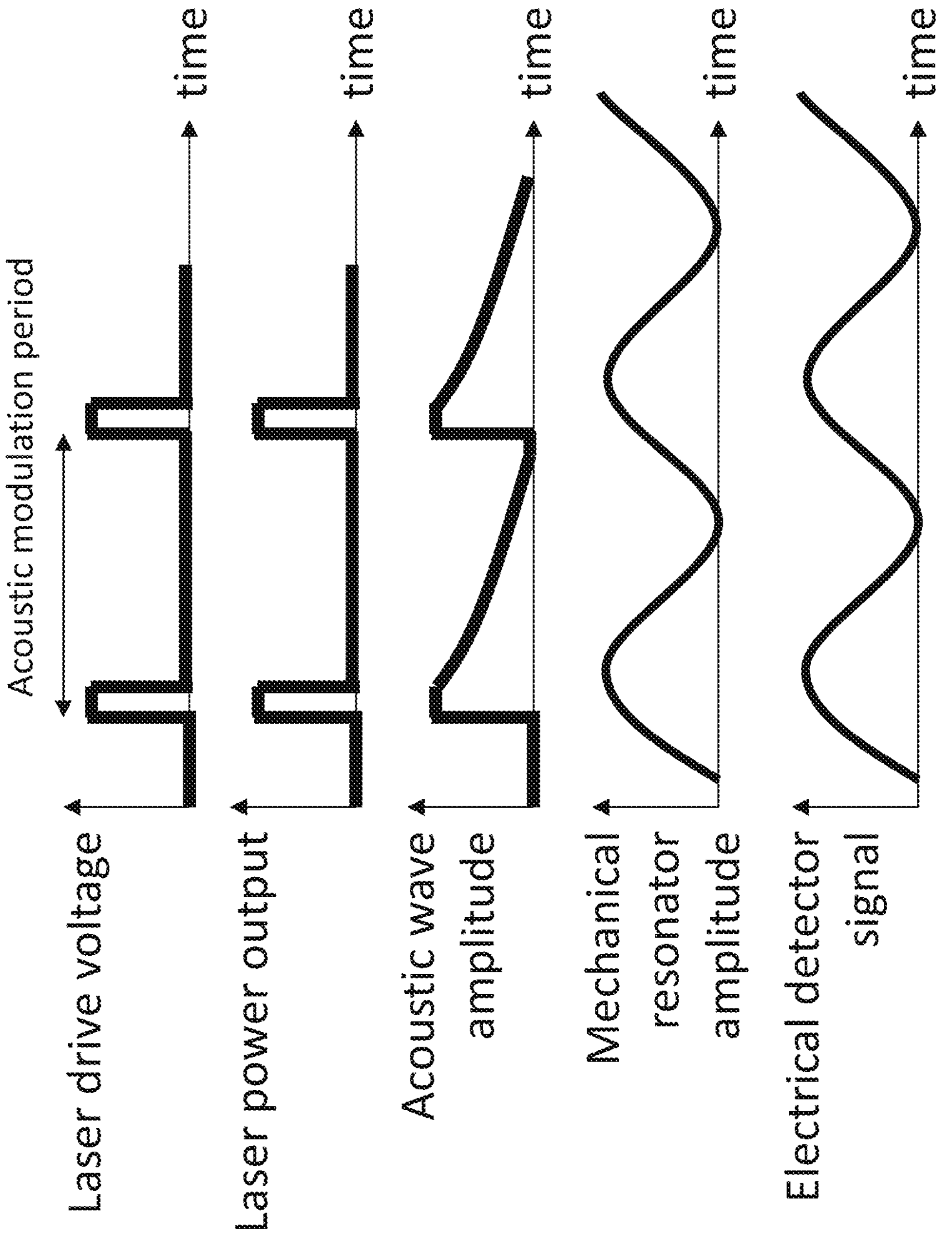

FIG. 1C shows the inputs and outputs in a conventional QEPAS or absorption spectroscopy measurement using a resonant detector. The top trace shows the laser drive voltage, which is a pulsed modulation scheme with a single electrical pulse per repetition period. The next trace shows the laser output power, which is also a single optical pulse per repetition period. When focused to a point in the gas, these optical pulses produce acoustic waves with sharp leading edges and exponentially decaying trailing edges as shown in the middle trace. The acoustic waves excite quasi-sinusoidal mechanical oscillations in the resonant detector (tuning fork) that in turn produce a quasi-sinusoidal electrical signal as shown in the bottom two traces of FIG. 1C.

Figure 1D:
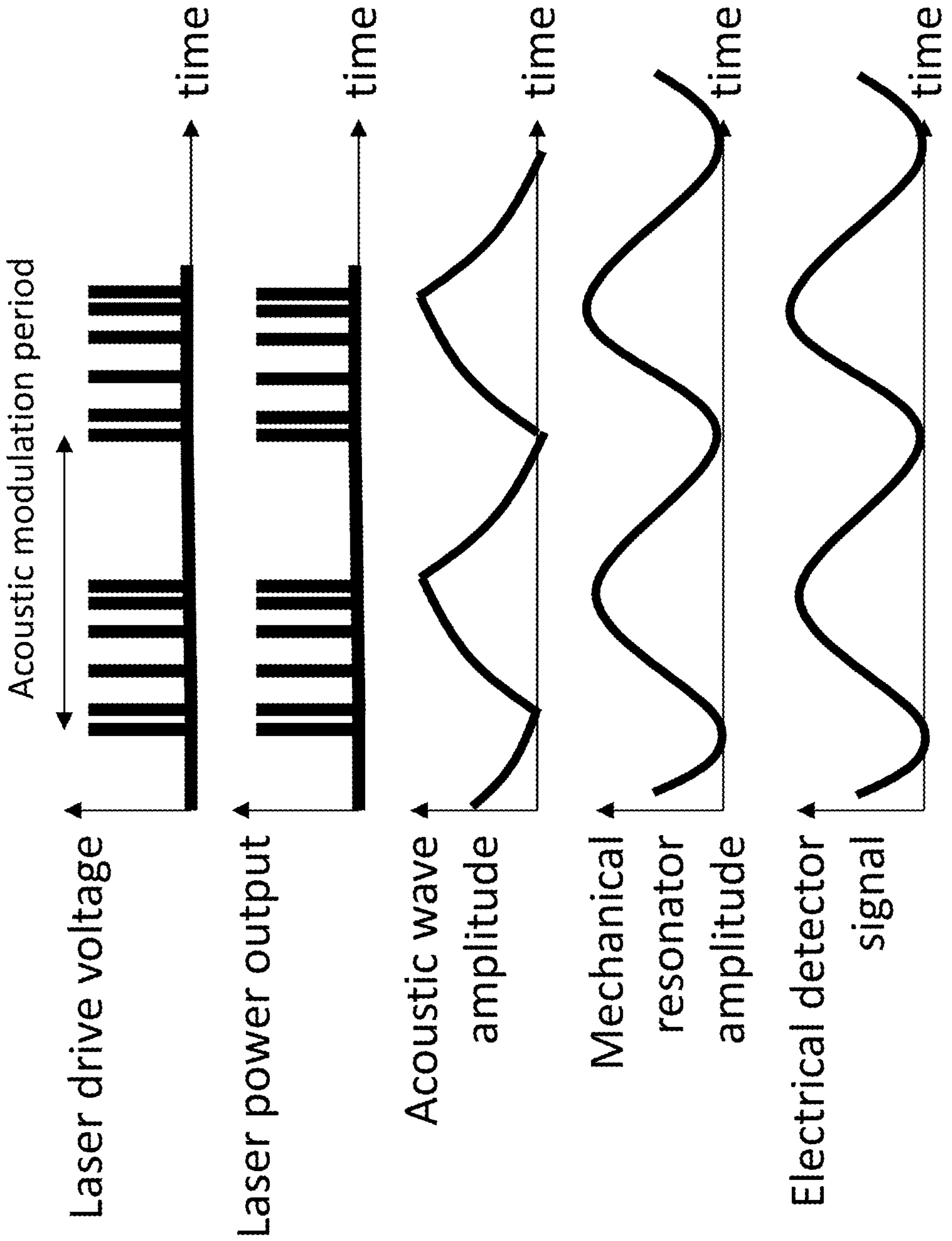

Instead of this usual method, we modulate a single-mode laser, such as a DFB QCL, with a complex pulse pattern formed by the periodic repetition (for example, at the tuning fork resonance frequency) of a short sequence of pulses, with varying duration, amplitude, and delays. The top trace in FIG. 1D shows one example of this complex pulse pattern. The single-mode laser emits the complex optical pulse pattern shown in the next trace in FIG. 1D (there may not be a one-to-one correspondence between the electrical pulses modulating the laser and the optical pulses emitted by the laser). In a QEPAS measurement, these optical pulses produce sawtooth-like acoustic waves (middle trace in FIG. 1D), which cause sine-like mechanical oscillations of the tuning fork (second-lower trace in FIG. 1D that in turn yield sine-like electrical signals (bottom trace in FIG. 1D).

We call the repetition period of the complex pulse pattern the "acoustic modulation period", as shown in FIG. 1D, to emphasize the fact that it is the period at which the acoustic waves are generated in order to excite the resonant detector used to sense the laser light reflected, transmitted, and/or scattered by the sample. It corresponds to the frequency that one may want to match to the resonant frequency of the resonant detector, which may be a tuning fork or an acoustic resonator.

The number of pulses composing this repeated pattern used to modulate the laser is another design parameter. By synthesizing this complex pulse sequence, it is possible to (1) shape the temperature profile (over time, within each modulation period) of the active region and thus the laser light frequency variation over time, within the duration of the modulation period; and (2) shape the frequency spectrum of the generated acoustic wave, and in particular the energy distribution between the fundamental modulation and its harmonics. In doing so, it is possible to increase the energy transfer to the acoustic wave and the strength of the signal measured by the resonant detector. Several strategies can be employed, including but not limited to: adjusting the number of sub-pulses, their heights, and their durations; adding sub threshold pulses to rapidly tune the laser center frequency; and adding a long and low amplitude pulse to the train of sub-pulses.

If desired, the pulse sequence shown in the top trace of FIG. 1D may be varied to slowly ramp the center frequency of the optical pulses emitted by the laser. For example, the pulse sequence may include a constant number of pulses per sequence period (e.g., 20 pulses in 15 μs, repeated every 30 μs), but with a slowly decreasing delay between pulses (e.g., from 0.79 μs to 0.3 μs). If desired, the pulse duration may vary from about 5 ns to about 5 μs. And the please pulse power may range from about 10 mW to about 500 mW. The exact pulse sequence, duration, delay, and amplitude may depend on the laser geometry, laser doping, how much energy is deposited in the active region volume, and what is the thermal conductivity of this volume. But as described below, a steady state can be established in just a few cycles (e.g., <5 μs total time), so that even if the temperature of the active region does not relax fully in between pulses, the temperature range spanned by a pulse can be equal to the one spanned by the previous pulses.

FIGS. 2A-2C show the time evolution of the modulation and laser light frequency for a single-mode pulsed laser. FIG. 2A shows the modulation used to drive the laser. The modulation has a pulse repetition frequency of 32.8 kHz, which matches the resonance frequency of readily available quartz tuning forks, and include a single drive pulse of 300 ns starting at t=0. FIGS. 2B and 2C show the wavelength of the laser, which has a thermal relaxation time constant for the active region of 0.8 μs (this thermal relaxation time constant is used in all following examples). It should be noted that the laser is only emitting light during the downward slope of the curve, while the upward slope reflects the cooling of the active region after the electrical driving pulse terminates. As can be seen, the laser chirps over 1.3 $cm^{-1}$ during the short duration of the electrical pulse, which is significantly larger than most gas absorption lines. A zoom-in in FIG. 2C shows that if, for example, a gas only absorbs between 2222.6 $cm^{-1}$ and 2222.8 $cm^{-1}$, then the photoacoustic signal is only generated during <50 ns of the total 300 ns of the pulse.

FIGS. 3A-3F show similar data for a laser modulated with a 300 ns driving pulse split into 6 pulses each 50 ns in duration (FIGS. 3A-3C) or 15 pulses each 20 ns in duration (FIGS. 3D-3F), with a 1 μs delay between pulses in both cases. This corresponds to the same total ON time for the laser in FIGS. 2A-2C, and thus the same energy consumption and total heat dissipation. However, by spreading that heat deposition over half the repetition period, the amplitude of the temperature variation of the active region, and consequently the amplitude of the chirp in the emitted laser beam is reduced. This enables more efficient use of the laser energy to generate the acoustic signal, since the frequency of the emitted laser light overlaps the analyte absorption band for a longer fraction of the time it is turned on.

FIGS. 3A and 3D are schematics illustrating the pulse patterns used to modulate the laser. FIGS. 3B and 3E show the expected temperature fluctuations of the active region in response to the pulse patterns in FIGS. 3A and 3D, respectively. (Note that the exact temperature variations may depend on the laser design, and in particular the laser ridge geometry, the active region doping, the active region efficiency, etc.) Finally, FIGS. 3C and 3F show the wavenumbers corresponding to the different temperatures in FIGS. 3B and 3E, respectively: there is a one-to-one mapping between the laser temperature and the wavenumber of the emitted light. Note that the laser is only lasing during the pulses, i.e., during the portion of the curves where the temperature increases and the wavenumber decreases. Note that the pulse height is indicated here and in the following figures as 15 V, as an example of above threshold voltage. This pulse height may be adjusted to the drive condition of the particular laser used.

FIGS. 3A-3F illustrate the increase in average power emitted within the absorption bandwidth of a narrow-line gas absorber, using the simulated temperature response of a QCL active region, and the corresponding wavenumber chirp of the laser light. As can be observed, breaking out a single long pulse into multiple shorter pulses can reduce the wavenumber range over which the laser chirps, thereby increasing the total power deposited within the narrow absorption bandwidth of a gas line.

FIG. 4A reports experimentally measured emission spectra confirming this effect using a pulsed distributed feedback quantum cascade laser. It shows how an increase in power is obtained within a narrow spectral bandwidth (0.5 $cm^{-1}$), for a constant laser bias, for an increasing number of short, identical sub-pulses. Each trace represents the emission spectrum for a different number of sub-pulses in each period of the laser modulation signal, with the number of pulse ranging from 1 (lowest peak) to 20 (highest peak). For this experiment, the repetition rate of the modulation pattern was 32 kHz, and the sub-pulses were all grouped into the first 15 μs of a quartz tuning fork modulation period (~30 μs).

FIG. 4B is a plot of average power emission spectrum versus number of sub-pulses (crosses) used to modulate single-mode power. The line is a linear interpolation. By allowing cooling of the active region between consecutive short pulses, the efficiency of the laser is also increased and we can observe in FIG. 4B that the average power scales linearly with the number of sub-pulses. This is to be contrasted to a drive scheme with a single pulse of increasing duration, for which typically the increase in average power with pulse width is sub-linear, reflecting the reduction in efficiency as the active region temperature increase during the pulse.

Differential PAS Measurements

Several QEPAS results reported in the literature use a so-called 2f-demodulation scheme. In this method, a CW laser is modulated by a sine wave such that its center frequency also follows a sine wave modulation centered on the gas absorption line. The laser center frequency thus crosses the peak of the absorption line twice within a period. In other words, a strong acoustic signal is generated at twice the frequency of the laser modulation. A lock-in set to detect that second harmonic will thus reject any signal at the fundamental laser modulation frequency, which could originate from a variety of sources such as electrical pick-up, light absorption by the tuning fork if the optical beam hits the fork, or acoustic signal generated by absorbers in the beam path, such as optical windows. Note that for efficient excitation of the second harmonic, the absorption line should be symmetric about its peak and the laser center frequency (i.e., its mean frequency over a modulation period) should match the peak absorption.

The 2f-demodulation technique cannot be implemented with standard pulsed patterns since the laser frequency crosses the maximum absorption only once per modulation period. However, we present here an alternative with some of the same advantages. For the sake of example, consider an absorption spectrum as shown in FIG. 5, featuring a narrow absorption line and a baseline absorption in the vicinity that is relatively featureless. The position and width of the two bands ('absorption line' and 'baseline absorption') are arbitrary here and in the following figures.

FIGS. 6A-6C illustrate a differential spectroscopic technique using a pulsed single-mode laser, such as a DFB QCL. FIGS. 6B and 6C show the temperature of the laser's active region and the laser wavenumber versus time, respectively, during one modulation period at 32.8 kHz for a single-mode laser modulated with the modulation pattern shown in FIG. 6A. During the first half of the period (0<t<15.2 μs), a train of 14 pulses, each 20 ns in duration and with a 1 μs delay between pulses. Then a second train of similar pulses is fired in the second half, summed in amplitude to a single 15 μs long pulse with a tenth of the amplitude of the previous pulses. That long pulse allows for an offset of the active region temperature and thus an offset in the wavenumber of the emitted light between the two half periods.

FIG. 6C shows the result of the modulation shown in FIG. 6A: (1) assuming the laser wavenumber overlaps the absorption line in only the first half period, the photoacoustic signal is only generated in the first half period, and it is modulated at 32.8 kHz, assumed to be here the resonance frequency of the tuning fork; (2) a second out-of-phase photoacoustic signal is generated during the second half of the modulation period. This signal is also modulated at 32.8 kHz.

By adjusting the amplitude, width or delay between the sub-pulses in FIG. 6A, it is possible to balance the two signals in FIG. 6C (on-line and off-line), for example, in the absence of the target gas analyte (e.g., during 'zero-gas' calibration), to obtain a differential measurement. Because the two signals are out-of-phase with respect to the acoustic modulation period, they subtract from one another in the final measured signal; (3) Finally, a background absorption or signal (e.g., from optical window absorption, or from the laser light hitting the tuning fork prongs) that is frequency insensitive on the scale of the intra-pulse laser wavenumber variations contributes to an equal signal during both half periods. In other term, the corresponding photoacoustic signal is modulated at 2f and thus can be rejected if the amplitude of only the fundamental modulation is measured. Note that this is the opposite strategy of the usual 2f-demodulation scheme often used in QEPAS, where the useful signal is modulated at 2f and the background is modulated at f.

The modulation scheme shown in FIG. 6A has several advantages, including but not limited to:

1) If a differential measurement is realized this way, between on- and off-line frequency bands, the measurement can have a reduced sensitivity to laser power variations over time.
2) If a strong background signal is generated (for example, if the laser beam hits the prong of a tuning fork), it can be separated from the useful chemically relevant signal since the background and chemically relevant signals are modulated at different frequencies.
3) By adjusting the amplitude, delay and width of the pulse sub-pattern, it is possible to adjust the amount of photoacoustic signal generated in different sections of the modulations. This can be used to increase the amount of photoacoustic signal generated from the absorption of the target analyte, reduce the amount of photoacoustic signal generated by baseline or background absorption, or balance the generation of photoacoustic in different sections of the modulations (for example, in- and out-of-phase signal components).
4) Any potential electrical pick-up signal is mostly modulated at a much higher frequency than the tuning fork resonance. Therefore, the modulation scheme can decrease the background signal (and its associated noise) due to electrical pick-up at the frequency at which the chemical information is coded and measured.

5) The advantages of this modulation scheme do not rely on a symmetry of the absorption feature about its peak. It can be implemented for fairly broad absorption features, assuming the laser can be tuned far enough.

We assumed above a narrow absorption line such that the laser center frequency can be tuned from 'on-line' to 'off-line' on a time scale smaller than the acoustic modulation period, by adjusting the complex pattern parameters (numbers of pulses, their amplitude, duration, delay, etc.). Some gases have relatively broad absorption lines (full width at half maximum of a few wavenumbers). For these gases, it may not be practical or even possible to switch between on- and off-line with intra-pulse tuning, although in the case of quantum cascade lasers, high doping of the active region can allow for intra-pulse tuning on the scale of 10 $cm^{-1}$ per microsecond at −4.5 microns wavelength. However, the modulation scheme presented here to achieve a differential measurement can still be used to measure the derivative (i.e., the slope) of the absorption line. A slow temperature ramp of the submount or heat sink can be used to slowly (i.e., at a time scale larger than the acoustic modulation period) tune the laser center frequency over the absorption line.

FIGS. 7A-7D illustrate another differential spectroscopic technique using a pulsed single-mode laser. FIG. 7A is a schematic illustrating the pulse patterns. FIG. 7B shows the expected temperature fluctuations of the single-mode laser's active region in response to the pulse pattern shown in FIG. 7A. FIG. 7C shows the wavenumbers of the laser output corresponding to the different temperatures shown in FIG. 7B. FIG. 7D shows a few cycles of the periodically pulsed laser beam, repeated with a 30 μs period.

Since it can be difficult in practice to adjust the electrical driving pulse height at the microsecond scale, or to sum two drive pulses as is used in FIGS. 6A-6C, we show in FIG. 7A another possible pulse pattern obtained by adjusting only the pulse durations and delays. In FIG. 7A, the modulation is as follow: during the first half of each period ($0<t<15.2$ μs) of the 32.8 kHz periodic pattern, a train of 14 pulses, each 20 ns in duration and with a 1 μs delay between pulses is used, followed by a train of 5 pulses, each 60 ns in duration and with a 0.8 μs delay between pulses, during the second half period. All pulses have the same height.

We note that it may be desired to tune the pulse pattern so that the on-line and off-line signals have equal amplitudes in the absence of analyte. This ensures zero signal in the absence of analyte and a zero-offset differential signal in the presence of an analyte. For example, one may adjust the number of pulses in each sub-sequence or their duration to achieve such tuning.

FIGS. 8A-8D illustrate yet another example of differential spectroscopic measurements using a pulsed single-mode laser. In FIG. 8A, the modulation of the laser is as follow: during the first half of each period ($0<t<15.2$ us) of the 32.8 kHz periodic pattern, a train of 50 pulses, each 20 ns in duration and with a 280 ns delay between pulses is used, followed by a train of 50 pulses, each 30 ns in duration and with a 270 ns delay between pulses, during the second half period. FIGS. 8B and 8C show the temperature of the laser's active region and the wavenumber of the laser's output, respectively, as a function of time when the laser is modulated with the pulse pattern shown on FIG. 8A. A few periods of the 32.8 kHz modulation are shown in FIG. 8D. Note that this later pulse scheme has a higher duty cycle (8.2%), implying higher heat dissipation of the laser.

The pulses pattern presented here are examples to illustrate different degrees of freedoms that are available to the designer. In general, we present using short burst of pulses within each period of the overall periodic signal (usually in resonance with the resonant detector, e.g., a tuning fork). The number, timing (duration, delay), and amplitude of the pulses can be adjusted to shape the active region temperature versus time, and thus the emitted light frequency versus time, on a time scale smaller than the acoustic modulation period. This is different from usual modulation schemes that typically use a simple periodic modulation, and sometimes add a slow modulation (for example, a drive current ramp) to slowly scan the laser center frequency through an absorption line at a time scale larger than the modulation period used to retrieve the signal.

The photoacoustic signal generation is governed by the V-T relaxation time of the molecules absorbing the light pulses. The V-T relaxation time is typically on the scale of tenth to hundreds of microseconds. By changing the pulse sub-pattern within the periods of the modulation, it is possible to shape the acoustic signal generated and thus the distribution of energy between the fundamental and the harmonics of the modulation, in order to increase or maximize the strength of the measured signal, depending on the demodulation scheme used. For example, if a lock-in amplifier is used to measure the amplitude of the fundamental modulation frequency, it may be desirable to maximize this amplitude by shaping the acoustic waveform. Alternatively, the amplitude of a higher ($n\geq 2$) harmonic may be measured, in which case it may be desirable to increase the excitation of higher harmonics.

FIGS. 9A and 9B show two different acoustic waveforms obtained with two different pulse schemes: in FIG. 9A, the modulation is a single 300 ns long pulse for each period of the 32.8 kHz modulation. In FIG. 9B, a train of 15 pulses, 60 ns in duration each is fired during the first half of the 32.8 kHz modulation period. As can be seen, the first scheme results in a sawtooth acoustic waveform shape while the second scheme results in a triangular waveform.

Integration of a Humidity Sensor

The photoacoustic signal strength is strongly impacted by the value of the V-T relaxation time of the analyte molecules. This time is itself a function of the gas composition (in addition to temperature and pressure sensitivities). In particular, the presence of water molecules has been shown to reduce the relaxation time and thus enable the generation of stronger signals when a fast modulation is used.

Consider a photoacoustic gas sensor measuring ambient air, with varying humidity. An initial calibration can be realized by measuring the effect of water concentration on the photoacoustic signal strength, for varying analyte concentrations, thus establishing an empirical relationship between water concentration and photoacoustic signal strength for varying analyte concentration. For instance, this empirical relationship may be established by calibrating the sensor (i.e., measuring the signal versus analyte concentration) under different humidity conditions and using the measurements to create calibration curves parametrized by humidity.

Then, a quantitative measurement can be obtained by (1) integrating a humidity sensor (or other sensor determining water vapor concentration) with the QEPAS sensor to measure the water concentration in the analyte; (2) measuring water concentration in the analyte at the time of measurement and using the established empirical relationship to model the expected photoacoustic signal strength as a function of analyte concentration; and (3) deriving the analyte concentration from the measured signal and established empirical relationship between water concentration and photoacoustic signal strength.

Electrical Pick-Up Signal Cancelation

One source of noise observed in QEPAS experiments is associated with possible electrical pick-up signal. For example, the laser driver, especially when driving pulsed lasers with short, high amplitude electrical pulses, can radiate electromagnetic waves that can be picked-up by the electronic circuit between the fork and the pre-amplifier, via electromagnetic induction. Ground loops are also often responsible for the apparition of pick-up signals. This problem can be exacerbated with lock-in detection, which will amplify any signal modulated at the same frequency as the pulse repetition rate. We presented above how the modulation scheme can be varied to mitigate this effect by modulating such pick-up signal at 2f and higher harmonics, while the chemically relevant signal is modulated at f.

Embodiments of the present technology include devices where the laser source is tightly integrated with the QEPAS fork and related electronics. In such devices, electrical pick-up signals can be larger because of the difficulty in electromagnetically shielding separate components from one another. Here, we present alternative devices and methods to mitigate this issue.

FIGS. 10A-10C shows a three-prong tuning fork where all three prongs 1, 2, and 3 are mechanically coupled (as illustrated by the dashed line in FIG. 10A). This tuning fork can be used as a resonant detector in an integrated QEPAS sensor. The laser light emitted by a single-mode laser in the QEPAS sensor is transmitted, scattered, and/or reflected by the sample and passes in between two prongs 1 and 2 but not through the other pair of prongs 2 and 3, as shown in a top view of the fork in FIG. 10A.

The wiring of the tuning fork is such that a voltage V1 is generated when the prongs 1 and 2 move symmetrically with respect to one another, i.e., when the prongs 1 and 2 move in opposite directions, either synchronously away from one another or closer to each other, these two cases generating, respectively, positive and negative voltages. This polarity is chosen arbitrarily to simplify the discussion and could be changed without loss of generality. The prongs 2 and 3 are wired to generate a voltage V2 of opposite polarity, i.e., a positive voltage is generated when the prongs 2 and 3 move closer to each other. A preamplifier (not shown) amplifies the difference between the voltages, V1-V2.

The acoustic wave generated by the relaxation of the gas between prongs 1 and 2 excites predominantly the anti-symmetric mode (FIG. 10C) that increases or maximizes the difference V1-V2. Conversely, a common excitation of the prong pairs 1-2 and 2-3 excites predominantly the symmetric mode (FIG. 10B), and thus reduces or minimizes the difference V1-V2. The electrical pick-up, assuming the geometry of the device (i.e., wire geometry, length, or orientation, presence of potential shielding, fork location, etc.) is chosen to increase or maximize the excitation of the symmetric mode by the electromagnetic interference, can thus be reduced or minimized.

In FIG. 11 we show a QEPAS setup 1100 using two forks 1101 and 1102 wired in such a way as to subtract the electrical signals generated by each fork. A differentiating pre-amplifier circuit 1103 can be used to perform that subtraction. The laser beam excites one fork 1101 and the second fork 1102 is positioned in such a way as to balance the electromagnetic interference signal picked up by the two forks. The second fork 1102 could be replaced by another component, such as a small antenna. This QEPAS setup 1100 cancels out the common electromagnetic pick-up driving both forks 1101 and 1102. Since the mechanical and electrical properties of a piezo-electric tuning fork are coupled, the resonance frequencies of the forks 1101 and 1102 may be matched to balance the pick-up signals excited in the two forks 1101 and 1102.

To account for potential differences in electromagnetic pick-up signal from the two forks 1101 and 1102 (or the fork and the antenna), a factory calibration can be realized, with the assumption that the relationship between the amplitude and phase of the two pick up signals is constant in time.

In FIG. 12, we show a circuit 1200 for electromagnetic pick-up noise subtraction. A switch 1210, realized here with transistors directly defined on a semiconductor laser chip 1202 (e.g., indium phosphide in the case of quantum cascade lasers), can allow for the alternating drive of a laser source 1220 and of a dummy load 1230 with electrical characteristics similar to the laser, located in close proximity to the laser 1220, e.g., on the same chip 1202. It is expected that the two loads (the laser 1220 and the dummy load 1230) and their mostly shared drive circuits, generate similar electromagnetic radiation when driven by current pulses. Two modulation schemes can then be realized:

(1) If f is the acoustic modulation frequency, the switch 1210 can alternate between driving the two loads at the same frequency f. In other words, the driver delivers pulses at a 2f repetition frequency, alternatively to the laser source 1220 and to the dummy load 1230 (a single pulse each per acoustic modulation period—or in a manner similar to the one described above, a short burst of pulses with total duration smaller than the acoustic modulation period). The electromagnetic pick-up signal is in this case modulated at 2f while the acoustic signal is modulated at f.

(2) The switch 1210 can allow for the drive of the laser source for several acoustic modulation periods, then drive the dummy load for a similar time. The signal is digitized and the two portions are later subtracted in digital domain.

QEPAS Integrated Implementations

We now present different device geometries to implement QEPAS spectrometers in compact form factors. The different geometries presented here integrate the semiconductor laser source and QEPAS spectrophone in compact sensing platforms. The solutions aim at simplifying the assembly process, for low-cost production. The basic elements of a QEPAS device are: (1) a semiconductor laser source; (2) a tuning fork transducer; (3) one or several optical elements to image the laser facet to a point between the fork prongs; and (4) electronics circuitry to drive the laser and amplify and digitize the tuning fork signal. We show how several of these elements can be integrated in an easy-to-assemble, low-cost platform.

In FIG. 13, we present a first device 1300 using a common patterned submount 1310 to mount a semiconductor laser chip 1320 (including a laser active region 1322 on a laser substrate 1324), an optical element (ball lens) 1330, and a tuning fork 1340. The optical element 1330 images the laser facet to a point in between the tuning fork prongs. A simple optical element such as a ball lens can be used. The submount 1310 may be pre-patterned with structures that can be lithographically or otherwise defined. These features can include one or several of the following: (1) a shallow stop ridge 1312 that the laser chip can be abutted to; (2) a dimple or v-shaped grooves 1314 to reference the position of the optics; (3) a slit that the tuning fork can be inserted into, or a pattern on the submount facet that the tuning fork can be received into. These alignment patterns can be etched or machined into the submount 1310, or can be based on the deposition of metal pads (potentially lithographically defined) that the elements are soldered to. A die bonder or micropositioner may be used to assemble the different elements in an automated fashion. The submount may be made of a range of different materials (silicon, aluminum nitride, aluminum oxide, . . . ) that are usually employed as submount materials for optical or electronic components. A common heat dissipation and temperature control interface 1350 may be used, such as a thermoelectric cooler, a passive heat sink, a vapor chamber, a heater, etc. The laser chip 1320 may be mounted epi-up or epi-down, depending on the desired thermal properties and heat dissipation constraints on the laser. The optical element 1330 may be refractive or reflective.

As shown in FIG. 14, an aperture in a mask 1442 (e.g., an iris) in close proximity to the tuning fork 1340 can be used for spatial filtering of the beam. In particular, the wings of the beam can be filtered out to avoid having them hit the tuning fork prongs and generate a background signal. In all implementations discussed here, including the device 1300 shown in FIG. 13, this feature can be added.

FIGS. 15A-15I show top views of QEPAS based on edge-emitting semiconductor lasers. The laser epi layers are in the plane of the schematic. The tuning fork prongs are represented as two crossed rectangles. The architectures shown in FIGS. 15A-15I can also be used for resonant thermomechanical measurements by allowing the laser light to hit the tuning fork instead of focusing the light between the tuning fork's prongs. This enables the tuning fork to act as a light intensity detector that measures a reduction in transmission (intensity dip, or in other words a negative signal) in the presence of an analyte.

Figure 15A:
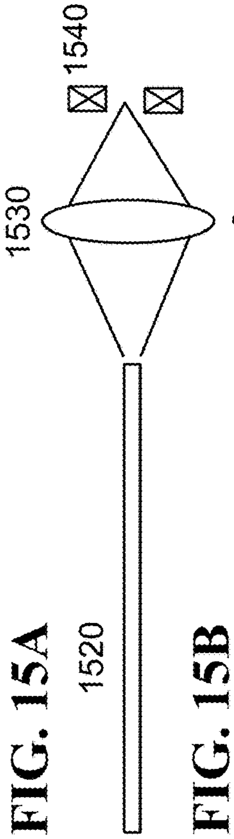

In FIG. 15A, a standard edge emitting semiconductor laser 1520 with a straight waveguide is free space coupled to an optical element 1530 (refractive or reflective) that images the laser facet to a point between the prongs of the tuning fork 1540.

Figure 15B:
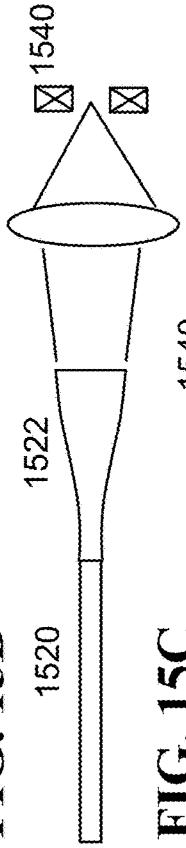

In FIG. 15B, we show that a tapered section 1522 can be used to reduce the beam divergence in the plane of the schematic ('in-plane').

Figure 15C:
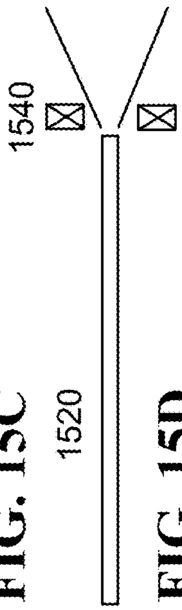

In FIG. 15C, we show that the tuning fork 1540 can be placed directly in front of the laser facet, without optical elements. The mitigations discussed above can be used to reduce any background signal due to electromagnetic interference or due to light hitting the fork prongs. Features on the semiconductor chip submount can be used to facilitate alignment of the laser waveguide and tuning fork. Such features may include: defining a slit into the submount that the fork is inserted into, defining a pattern (groove or solder pad) on the edge of the submount that can receive the fork in a particular position. The laser chip itself may be aligned precisely with the submount features (e.g., solder pad) using a die bonding equipment.

Figure 15D:
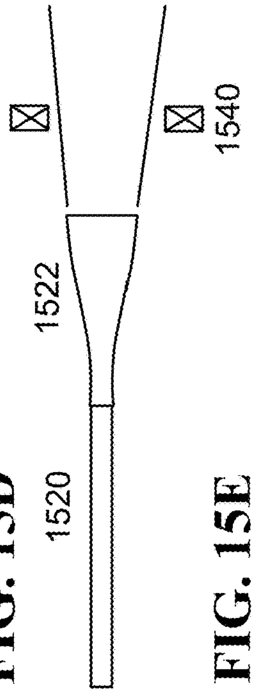

In FIG. 15D, we show that the tapered section 1522, reducing the in-plane beam divergence, can be used to reduce risk of light hitting the tuning fork prongs. The geometry of the tuning fork 1540 may be such that the space between the prongs is much higher than it is wide. The vertical (out of plane) divergence of the beam is thus far less likely to result in a background signal.

Figure 15E:
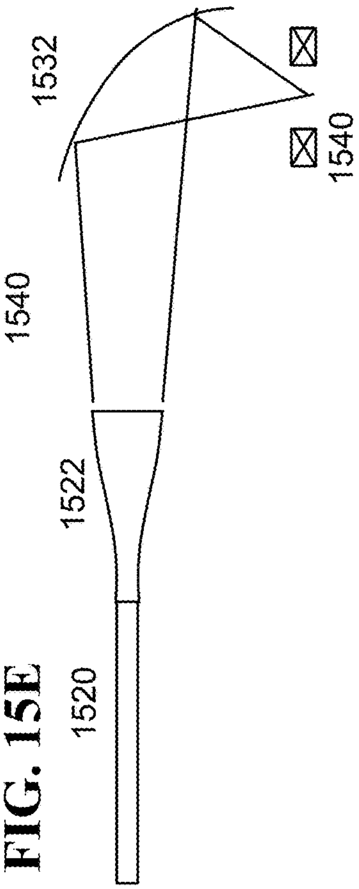

In FIG. 15E, we show how a focusing reflective optic 1532 can be used to image the laser facet to a point between the tuning fork prongs.

Figure 15F:
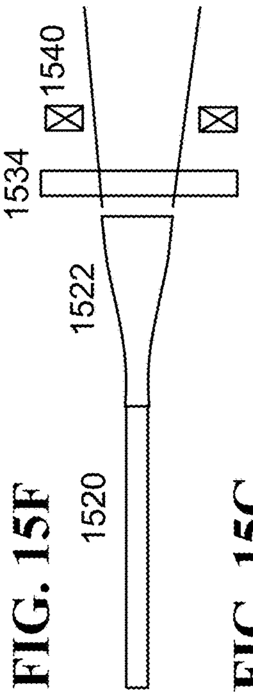

In FIG. 15F, we show that a cylindrical lens 1534 can be used to collimate the laser beam in the out-of-plane direction, while a reduction of divergence in the plane of the schematic is achieved for example with a tapered waveguide section 1522 in front of the laser. This tapered section can be active or passivated, as discussed below.

Figure 15G:
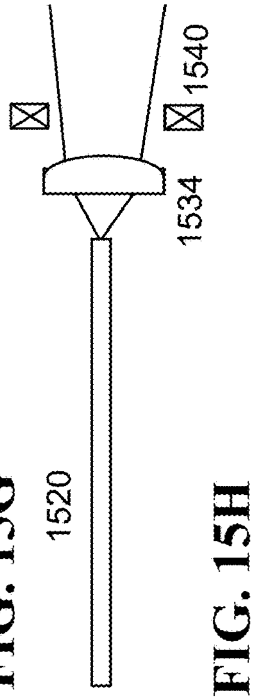

In FIG. 15G, we show that a cylindrical lens 1534 (rotated 90 degrees about the optical axis from its orientation in FIG. 15F) can be used to collimated the laser beam in the plane of the schematic. The geometry of the tuning fork 1540 is such that the spacing between the prongs is narrow and high (several millimeters long). In other words, the dimension of the spacing between the prongs in the direction out-of-plane of the schematic is a few millimeters, compared to typically a few hundred micrometers for the prong spacing in the plane of the schematic. The divergence of the laser beam out of the schematic plane is thus less likely to cause background signal by hitting the prongs. It may thus be left uncollimated. This can simplify alignment and the assembly process.

In the case of a quantum cascade laser, the substrate and cladding materials are typically InP while the active region is composed of InGaAs and InAlAs. The index contrast between InGaAs/InAlAs and InP allows for vertical optical confinement (out-of-plane). In-plane confinement is usually provided by etching a waveguide structure. An insulator and a material contact can further define lateral confinement. The optical losses are dominated by free carrier absorption. Ion implantation can create traps for the free carriers to passivate the material, making it electrical insulating and optically low loss. Such a process can be used to passivate the tapered section 1522 and or the optical relay section. An integrated focusing reflector (like the optic 1532 in FIG. 15E) can be define by etching a groove in the laser material, followed by deposition of a reflective metal layer.

Figure 15H:
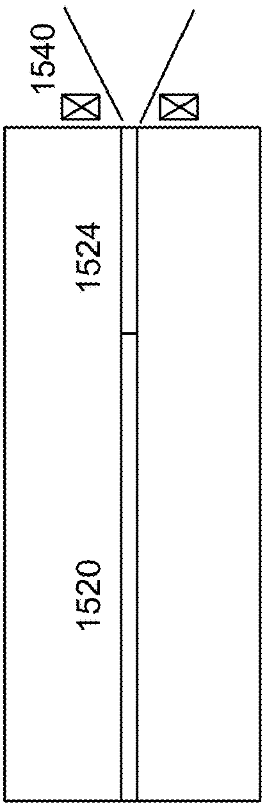
Figure 15I:
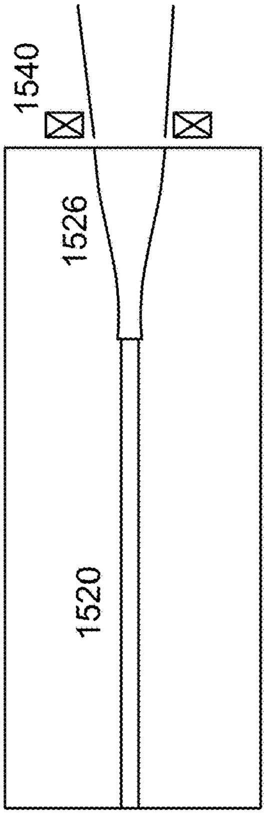

In FIGS. 15H and 15I, we show that a section of passivated straight material 1524 or passivated tapered material 1526 can be used to separate the active material 1520 from the tuning fork, in case the fast temperature rise of the active region 1520 creates acoustic waves propagating in air from the facet of the laser. Such waves may be picked up by the tuning fork 1540 and may result in a background signal. A short (10-500 μm) section of passive material may prevent the waveguide facet (i.e., the area where the light is exiting the semiconductor chip) from experiencing significant temperature variations, and thus avoid or reduce the generation of acoustic waves. The tuning fork 1540 may thus be placed in close proximity to the semiconductor chip edge with less risk of picking up a background signal from temperature variations of the laser material. The passivation can be realized as discussed above.

In FIGS. 16A and 16B, we show that the optical relay function achieved with external optical elements in the systems shown in FIG. 15 (i.e., the imaging of the laser facet onto a point located between the tuning fork prongs), can be integrated into the semiconductor material itself. The laser may use a tapered section 1522 as shown, although this is not required. The tapered section 1522 as well as the optical relay sections of the chip may be passivated and made transparent by ion implantation or selective area regrowth. The vertical confinement is provided by a slab waveguide geometry, for example, using the laser active material as core, and the laser cladding material as cladding. The location of the focus can be chosen to be near the semiconductor chip edge (from a few micrometers to a few millimeters) to facilitate assembly by bonding or otherwise mechanically registering the tuning fork to the semiconductor chip itself, or its submount.

In FIG. 16A, the optical relay is achieved by etching a curved (e.g., parabolic or elliptical) reflecting groove 1630 that images the laser facet onto a point between the tuning fork prongs.

In FIG. 16B, the optical relay is achieved by a waveguide lens 1632, realized, for example, by etching a pattern in the semiconductor laser top cladding to vary spatially the effective refractive index of the guided mode. The pattern may be a subwavelength hole of groove pattern, or it may be a single large dimple defined by greyscale lithography. Alternatively, ion implantation can be used to tune spatially the effective refractive index of the guided mode.

In FIGS. 17A-17C, we show that surface emission of the semiconductor laser (e.g., quantum cascade laser) can be obtained by etching an angled facet at one end of the laser waveguide 1722*a*-1722*c*, so as to reflect the laser light towards the substrate or towards the top cladding. Openings in the metallization of either the bottom laser substrate 1724 or the top cladding 1726*a*-1726*c* allow the light to escape to air. In FIG. 17A, the laser is more conveniently mounted epi-side up, whereas the geometry shown in FIG. 17B is more amenable to flip-chip mounting of the semiconductor laser chip. The angle chosen may be 45 degrees, but other angles may be used, for example for ease of manufacturing by using wet etching along crystalline planes. Since low laser feedback is expected at this etched facet, the laser may include either an etched reflecting structure (such as a deep groove) before the facet (as shown in FIG. 17C), or the laser would be a distributed feedback laser that does not rely on facet reflection to build up the intracavity light intensity.

In FIG. 18A a schematic of the laser 1800 is shown, with substrate emitting laser mounted epi-side down. The laser 1800 includes an active region 1822 sandwiched between a laser substrate 1824 and a laser cladding 1826, which are sandwiched in turn between a submount 1810 and a low-growth substrate. FIG. 18B shows a cross-section of the device 1800, showing the InP:Fe regrowth of the buried hetero-structure 1801, the high mobility 2D electron gas used for back contact 1802 and the metal via 1803 connecting the back contact 1802 and the submount 1810. This illustrates how to route the two terminals of the laser diode to the same side of the wafer, allowing contacting of both terminals with a single step flip-chip bonding. This offers the advantage to allow for the use of a low-doped (low electrical conductivity and low optical losses) substrate, to avoid optical losses as the beam propagates through the substrate.

In FIG. 19, we show an exploded view of an integrated QEPAS sensor 1900 (subassembly) with laser source 1920, optical element 1930, aperture 1942, and tuning fork 1940. These components can be assembled with a wafer-bonding type process as shown in FIG. 20, whereby the different functionalities are merged into a single subassembly by bonding wafers with two dimensional arrays of lasers 1920, lenslet arrays 1930, apertures 1942, and tuning forks 1940. After dicing the bonded wafer stack (or a substack) into single discrete assemblies, these can be die bonded to a submount. Several subassemblies can be bonded to a single submount 1910. The submount can be mounted onto an electronics board or other system components, for example, with ball bonding as shown in FIG. 19.

In the device shown in FIG. 19, the laser 1920 is substrate-emitting (i.e., the laser light is directed towards the substrate with an angled facet) and includes an active region 1922 between a cladding 1924 and a laser substrate 1926. In the next layer, a lenslet 1930 or other optical component compatible with low-profile wafer-scale manufacturing (e.g., a metamaterial flat lens) is used to image the laser facet onto a point in between the prongs of the tuning fork 1940. The next layer can be a silicon wafer with integrated drive circuitry and preamplifier for the tuning fork 1940. An array of apertures 1942 in this wafer allows the light to pass through and reach the upper wafer containing the tuning fork 1940. This aperture 1942 can be used for spatial filtering of the laser beam, to remove side lobes or 'wings', and prevent generation of a background signal that would occur if some laser light was directly hitting the prongs of the tuning fork. The last layer contains the tuning fork 1940 and its metalized contacts. An opening behind the fork allows the light to freely escape without being absorbed or scattered by the tuning fork layer material. The optics 1930 and aperture 1942 layers are optional, depending on the level of integration desired.

In a possible assembly process, wafers containing the optics 1930 and lasers 1920 would be first aligned and bonded to one another. The wafers containing the apertures 1942 and tuning forks 1940 would be similarly aligned and bonded. Finally, the two pairs of bonded wafers would be aligned and bonded.

Alternatively, the optics wafer may be aligned and bonded to the laser wafer, then the aperture wafer to the bonded optics and laser wafers, then the tuning fork layer to the bonded aperture, optics, and laser wafers.

Metal vias through the different wafers can enable the routing of power and electrical signals from one layer to its neighboring layers. Electrical connections between the sensor subassembly and the rest of the system may be done at the bottom of the stack (the tuning fork layer) by soldering to a metalized submount or using wire bonds between the submounts and the top layer, or intermediate layers provided opening in the upper layers are defined prior to assembly.

As shown in FIG. 19, the sensor subassembly may be realized so as to partially enclose the tuning fork 1940 in a cavity. By selecting the materials forming the walls of this cavity, and in particular by using electrically conductive materials (doped semiconductor, deposition of a metal layer on the walls), a Faraday cage may be realized to help isolate the tuning fork 1940 from electromagnetic interferences.

The walls of the tuning fork cavity may also be coated with chemicals for selective absorption or adsorption of target analytes via weak reversible chemical bonds, thereby providing a concentration function. A thin film heater may be embedded in one of the layer (for example, the aperture layer) to trigger the release of the analytes for immediate analysis by the sensor 1900. That desorption may be realized with a succession of well-defined temperatures or with well-defined temperature ramps to allow for time-resolved desorption study. This may allow different analytes to be measured at separate times, and thereby lowers the risk of chemical interference in the measurement.

A heater may be embedded in a layer (for example, in the aperture layer). For example, a thin electrical conductor may be defined on the aperture layer such that when current flows through the conductor, heat is deposited into the subassembly by Joule effect. Such heater may be used to remove contaminant that may have been deposited on the fork of the surrounding walls, potentially affecting the measurement.

System decontamination by heating the entire system or some subsection of the system may be evaluated by monitoring the resonance curve of the tuning fork. To acquire such resonance curve, a sinusoidal voltage may be applied to the tuning fork, and its response may be monitored. A shift or change on amplitude of the resonance peak may indicate contamination.

In FIG. 20, we show how different prefabricated wafers may be bonded together and then diced to yield sensor subassemblies, as discussed above with respect to FIG. 19.

In FIGS. 21A-21D, we present a set of QEPAS sensors 2100*a*-2100*d* with surface emitting semiconductor lasers 1920 that can be modulated using any of the pulse modulation schemes disclosed herein. All schematics show the devices 2100*a*-2100*d* seen from the side (cross section along the length of the lasers). Each device 2100 includes a laser active region 2122 that is between a laser substrate 2124 and a laser cladding 2126 and that emits a laser beam that is imaged between the prongs of a tuning fork 2140. The tuning fork prongs 2140 are represented as two crossed rectangles in most drawings.

Figures 21A, 21B, 21C, 21D:
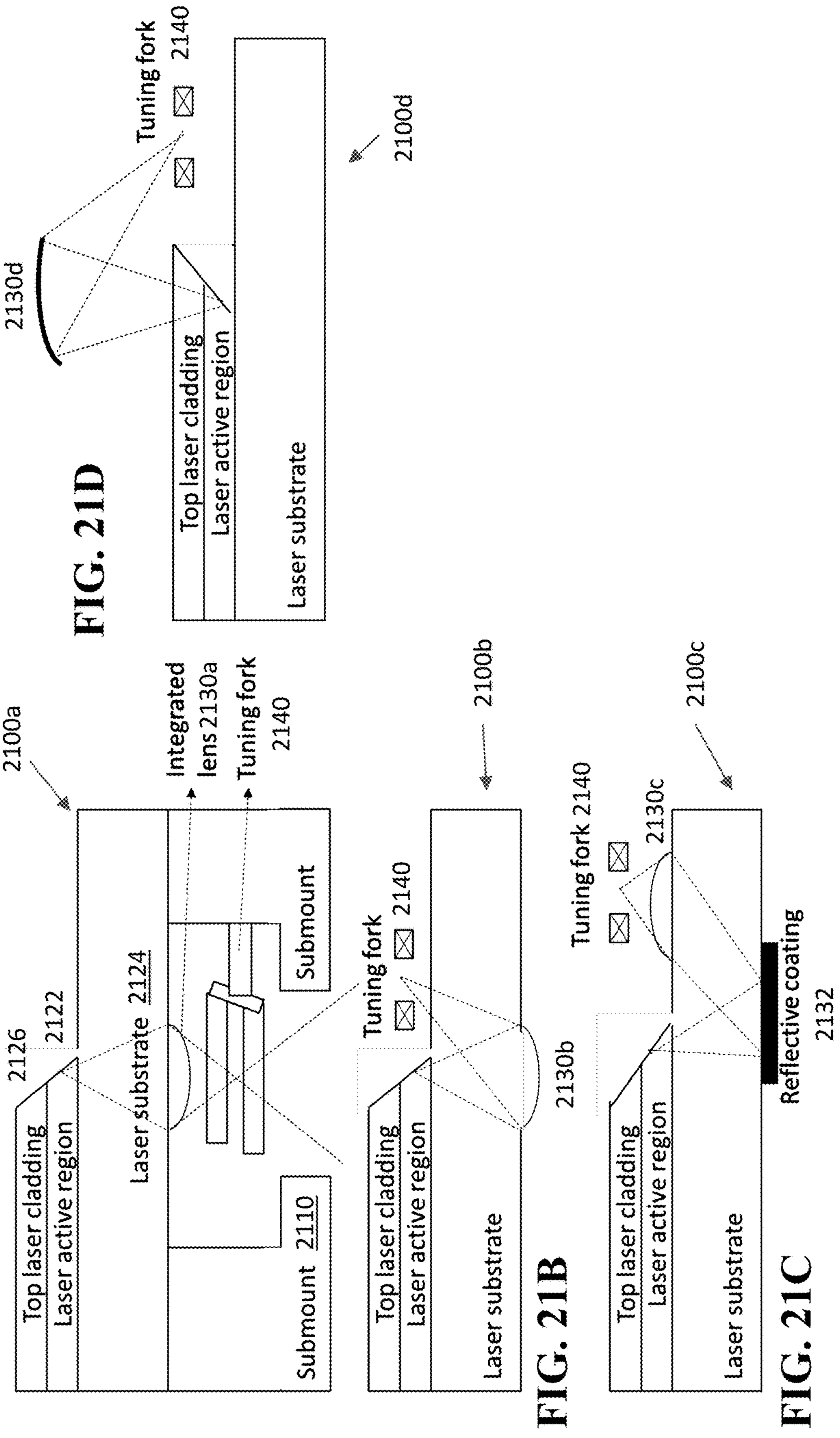

In FIG. 21A, an angled facet (e.g., 45 degree) is defined at one end of the laser waveguide 2122 to direct the light towards the substrate 2124. The laser substrate 2124 may be thinned down to between 50 μm and 500 μm to reduce optical losses. Semi-insulating material, such as low-doped or iron doped InP, may be used in the case of quantum cascade lasers. The light diverges from the angled facet. At the bottom of the substrate 2124, an optical element 2130*a* may be integrated, for example by (1) bonding of a micro-optical element such as a small refractive lens; (2) etching of a lens into the substrate material; (3) etching of a metamaterial flat lens into the substrate material, formed for example by a series a thin grooves; (4) deposition and patterning of a material (dielectric or metal) to define a flat lens (Fresnel lens, metasurface lens) onto the substrate bottom surface. This optical component 2130*a* forms the image of the laser facet onto a small spot located a short distance beneath the substrate surface (from a few micrometers to a few millimeters). The tuning fork 2140 can be positioned at this spot, and potentially integrated into a hollow submount 2110 as shown in FIG. 21A. The submount can have an opening in the beam path below the tuning fork to avoid light absorption and generation of acoustic waves.

In FIG. 21B, a reflective optical element 2130*b* is defined on the bottom side of the substrate 2124 to form the image of the laser facet on the laser side of the wafer. The optical element 2130*b* may be defined using the methods described above. An anti-reflection coating (not shown) may be used to reduce reflection at the top substrate surface where the beam emerges into the air. This geometry may allow easier integration and alignment of the tuning fork on the laser-side of the chip. The tuning fork 2140 may be fabricated out of the same semiconductor material as the laser itself (e.g., InP) and thus fabricated with similar microfabrication techniques as the laser itself (photolithography, wet/dry etching, etc.).

In FIG. 21C, the bottom substrate surface is coated by a reflective material 2132 but is otherwise flat. Imaging of the laser facet to a point a short distance above the wafer surface is achieved with an optical element 2130*c* integrated (following any of the methods described above) onto the top substrate surface. As in FIG. 21B, the tuning fork 2140 may be fabricated directly from the laser material or made from other materials including quartz aligned and assembled a short distance (few micrometers to a few millimeters) above the semiconductor laser chip surface.

In FIG. 21D, the angled facet is defined in such a way as to direct the light towards the top cladding. An external optical element 2130*d* may be aligned above the semiconductor laser chip to image the laser facet to a point a short distance above the chip surface, where a tuning fork 2140 may be aligned and attached to the chip.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein, unless clearly indicated to the contrary, should be understood to mean "at least one."

The phrase "and/or," as used herein, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in any claims, "consisting of," will refer to the inclusion of exactly one element of a number or list of elements. In general, the term "or" as used herein shall only be interpreted as indicating exclusive alternatives (i.e., “one or the other but not both”) when preceded by terms of exclusivity, such as “either,” “one of,” “only one of,” or “exactly one of” “Consisting essentially of,” when used in any claims, shall have its ordinary meaning as used in the field of patent law.

As used herein, the phrase “at least one,” in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase “at least one” refers, whether related or unrelated to those elements specifically identified. Thus, as a non-limiting example, “at least one of A and B” (or, equivalently, “at least one of A or B,” or, equivalently “at least one of A and/or B”) can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

As used herein, all transitional phrases such as “comprising,” “including,” “carrying,” “having,” “containing,” “involving,” “holding,” “composed of,” and the like are to be understood to be open-ended, i.e., to mean including but not limited to. Only the transitional phrases “consisting of” and “consisting essentially of” shall be closed or semi-closed transitional phrases, respectively, as set forth in the United States Patent Office Manual of Patent Examining Procedures, Section 2111.03.

The invention claimed is:

1. A laser comprising:

a laser substrate, wherein the laser substrate is a semi-insulating substrate;

an active layer disposed on the laser substrate and comprising a hetero-structure to emit mid-infrared light;

a cladding layer, disposed on the active layer, to confine the mid-infrared light within the active layer;

an angled facet, formed at the active layer and inclined with respect to a plane of the active layer, to reflect the mid-infrared light out of the plane of the active layer; and a conductive layer between the cladding layer and the semi-insulating substrate, wherein the conductive layer is a high mobility 2D electron gas.

2. The laser of claim 1, wherein the laser is a distributed feedback laser.

3. The laser of claim 1, wherein the laser is a quantum cascade laser.

4. The laser of claim 1, wherein the laser substrate has a thickness of about 50 μm to about 500 μm.

5. The laser of claim 1, wherein the angled facet is angled to reflect the mid-infrared light towards the laser substrate.

6. The laser of claim 5, further comprising:

an optical element integrated at the bottom of the laser substrate.

7. The laser of claim 6, wherein the optical element is a micro-optical element.

8. The laser of claim 6, wherein the optical element is a lens etched into the laser substrate.

9. The laser of claim 6, wherein the optical element is a flat lens etched into the laser substrate.

10. The laser of claim 6, wherein the optical element is a flat lens etched into a material deposited on the bottom of the laser substrate.

11. The laser of claim 1, wherein the angled facet is angled to reflect the mid-infrared light away from the laser substrate.

12. The laser of claim 1, wherein the angled facet extends across the active layer and at least a portion of the cladding layer.

13. The laser of claim 1, wherein the angled facet extends across the active layer, the cladding layer, and at least a portion of the laser substrate.

14. The laser of claim 1, wherein the angled facet is inclined at an angle of approximately 45 degrees with respect to the plane of the active layer.

15. The laser of claim 1, wherein the hetero-structure is a buried hetero-structure.

16. The laser of claim 1, wherein the semi-insulating substrate is a low-doped InP substrate.

17. The laser of claim 1, wherein the semi-insulating substrate is an iron-doped InP substrate.

18. The laser of claim 1, further comprising:

a submount supporting the laser substrate;

a conductive via connecting the conductive layer to a first terminal between the submount and the laser substrate; and a second terminal between the submount and the laser substrate.

19. The laser of claim 1, further comprising:

an etched reflective structure before the angled facet.

20. The laser of claim 19 wherein the etched reflective structure is a notch.

21. The laser of claim 1, further comprising:

metallization on at least one of the laser substrate or the cladding layer, the metallization defining an opening to allow the mid-infrared light to escape the laser.

22. A spectroscopic system comprising:

the laser of claim 1 to illuminate a sample with the mid-infrared light; and a detector to detect radiation reflected and/or scattered by the sample in response to the mid-infrared light.

23. The spectroscopic system of claim 22, further comprising:

a lens, formed in and/or on the laser substrate, to focus the mid-infrared light to a point proximate to the detector.

24. The spectroscopic system of claim 22, further comprising:

a reflector, formed in and/or on the laser substrate, to reflect the mid-infrared light toward to the detector.

25. The spectroscopic system of claim 22, wherein the detector comprises a tuning fork.

26. A laser comprising:

a laser substrate, wherein the laser substrate is a semi-insulating substrate;

an active layer disposed on the laser substrate and comprising a hetero-structure to emit mid-infrared light;

a cladding layer, disposed on the active layer, to confine the mid-infrared light within the active layer;

an angled facet, formed at the active layer and inclined with respect to a plane of the active layer, to reflect the mid-infrared light out of the plane of the active layer;

a conductive layer between the cladding layer and the semi-insulating substrate;

a submount supporting the laser substrate;

a conductive via connecting the conductive layer to a first terminal between the submount and the laser substrate; and a second terminal between the submount and the laser substrate.

* * * * *